United States Patent
Yang et al.

(10) Patent No.: US 9,245,772 B2
(45) Date of Patent: Jan. 26, 2016

(54) STACKABLE PACKAGE BY USING INTERNAL STACKING MODULES

(71) Applicant: STATS ChipPAC, Ltd., Singapore (SG)

(72) Inventors: JoungIn Yang, Kyoungkido (KR); ChoongBin Yim, Kyungki-do (KR); KeonTeak Kang, Kyoungki-do (KR); YoungChul Kim, Kyonggi-do (KR)

(73) Assignee: STATS ChipPAC, Ltd., Singapore (SG)

( * ) Notice: Subject to any disclaimer, the term of this patent is extended or adjusted under 35 U.S.C. 154(b) by 0 days.

(21) Appl. No.: 14/328,348

(22) Filed: Jul. 10, 2014

(65) Prior Publication Data

US 2014/0319702 A1 Oct. 30, 2014

Related U.S. Application Data

(63) Continuation of application No. 12/882,748, filed on Sep. 15, 2010, now abandoned, which is a continuation-in-part of application No. 11/771,086, filed on Jun. 29, 2007, now Pat. No. 7,800,211.

(51) Int. Cl.
*H01L 21/44* (2006.01)
*H01L 21/48* (2006.01)
(Continued)

(52) U.S. Cl.
CPC ............ *H01L 21/561* (2013.01); *H01L 21/486* (2013.01); *H01L 23/147* (2013.01); *H01L 23/3114* (2013.01); *H01L 23/3128* (2013.01); *H01L 23/3135* (2013.01); *H01L 23/49827* (2013.01); *H01L 24/29* (2013.01); *H01L 24/48* (2013.01); *H01L 25/03* (2013.01); *H01L 24/02* (2013.01); *H01L 24/28* (2013.01); *H01L 24/45* (2013.01); *H01L 2224/0401* (2013.01); *H01L 2224/05611* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/16* (2013.01); *H01L 2224/16235* (2013.01); *H01L 2224/2919* (2013.01); *H01L 2224/2929* (2013.01); *H01L 2224/29111* (2013.01); *H01L 2224/29299* (2013.01); *H01L 2224/32225* (2013.01); *H01L 2224/45124* (2013.01);
(Continued)

(58) Field of Classification Search
CPC ............ H01L 23/3128; H01L 23/3135; H01L 21/486
USPC ........... 257/686, 777, E23.169; 438/109, 617
See application file for complete search history.

(56) References Cited

U.S. PATENT DOCUMENTS

5,784,264 A * 7/1998 Tanioka .................. H01L 25/03
257/E25.002
5,798,564 A * 8/1998 Eng ...................... H01L 25/0657
257/686

(Continued)

*Primary Examiner* — Nitin Parekh
(74) *Attorney, Agent, or Firm* — Robert D. Atkins; Patent Law Group: Atkins and Associates, P.C.

(57) ABSTRACT

A semiconductor package comprises a substrate, a first semiconductor die mounted to the substrate, and a first double side mold (DSM) internal stackable module (ISM) bonded directly to the first semiconductor die through a first adhesive. The first DSM ISM includes a first molding compound, and a second semiconductor die disposed in the first molding compound. The semiconductor package further comprises a first electrical connection coupled between the first semiconductor die and the substrate, and a second electrical connection coupled between the first DSM ISM and the substrate.

23 Claims, 20 Drawing Sheets

(51) Int. Cl.
  *H01L 21/56* (2006.01)
  *H01L 23/14* (2006.01)
  *H01L 23/31* (2006.01)
  *H01L 23/498* (2006.01)
  *H01L 25/03* (2006.01)
  *H01L 23/00* (2006.01)

(52) U.S. Cl.
  CPC ............ *H01L2224/45144* (2013.01); *H01L 2224/48091* (2013.01); *H01L 2224/48225* (2013.01); *H01L 2224/48227* (2013.01); *H01L 2224/48247* (2013.01); *H01L 2224/48464* (2013.01); *H01L 2224/48611* (2013.01); *H01L 2224/48624* (2013.01); *H01L 2224/48639* (2013.01); *H01L 2224/48644* (2013.01); *H01L 2224/48647* (2013.01); *H01L 2224/48655* (2013.01); *H01L 2224/48711* (2013.01); *H01L 2224/48724* (2013.01); *H01L 2224/48739* (2013.01); *H01L 2224/48744* (2013.01); *H01L 2224/48747* (2013.01); *H01L 2224/48755* (2013.01); *H01L 2224/73204* (2013.01); *H01L 2224/73265* (2013.01); *H01L 2224/78301* (2013.01); *H01L 2224/83192* (2013.01); *H01L 2224/83805* (2013.01); *H01L 2224/85205* (2013.01); *H01L 2224/85411* (2013.01); *H01L 2224/85424* (2013.01); *H01L 2224/85439* (2013.01); *H01L 2224/85444* (2013.01); *H01L 2224/85447* (2013.01); *H01L 2224/85455* (2013.01); *H01L 2224/92247* (2013.01); *H01L 2924/00013* (2013.01); *H01L 2924/014* (2013.01); *H01L 2924/01005* (2013.01); *H01L 2924/0105* (2013.01); *H01L 2924/01006* (2013.01); *H01L 2924/01013* (2013.01); *H01L 2924/01014* (2013.01); *H01L 2924/01022* (2013.01); *H01L 2924/01023* (2013.01); *H01L 2924/01028* (2013.01); *H01L 2924/01029* (2013.01); *H01L 2924/01031* (2013.01); *H01L 2924/0132* (2013.01); *H01L 2924/01033* (2013.01); *H01L 2924/01047* (2013.01); *H01L 2924/01049* (2013.01); *H01L 2924/01074* (2013.01); *H01L 2924/01077* (2013.01); *H01L 2924/01078* (2013.01); *H01L 2924/01079* (2013.01); *H01L 2924/01082* (2013.01); *H01L 2924/01083* (2013.01); *H01L 2924/01322* (2013.01); *H01L 2924/12041* (2013.01); *H01L 2924/1306* (2013.01); *H01L 2924/13091* (2013.01); *H01L 2924/14* (2013.01); *H01L 2924/1433* (2013.01); *H01L 2924/157* (2013.01); *H01L 2924/15311* (2013.01); *H01L 2924/15331* (2013.01); *H01L 2924/181* (2013.01); *H01L 2924/1815* (2013.01); *H01L 2924/19041* (2013.01); *H01L 2924/19107* (2013.01)

(56) References Cited

U.S. PATENT DOCUMENTS

| | | | | |
|---|---|---|---|---|
| 6,051,878 | A * | 4/2000 | Akram | H05K 1/144 257/678 |
| 6,101,100 | A | 8/2000 | Londa | |
| 6,153,928 | A | 11/2000 | Cho | |
| 6,239,496 | B1 * | 5/2001 | Asada | 257/777 |
| 6,388,333 | B1 | 5/2002 | Taniguchi et al. | |
| 6,762,488 | B2 * | 7/2004 | Maeda | H01L 21/568 257/686 |
| 6,798,057 | B2 * | 9/2004 | Bolkin | H01L 25/105 257/637 |
| 7,196,418 | B2 * | 3/2007 | Ohno et al. | 257/723 |
| 7,288,434 | B2 | 10/2007 | Karnezos | |
| 7,671,459 | B2 * | 3/2010 | Corisis et al. | 257/686 |
| 2004/0113275 | A1 | 6/2004 | Karnezos | |
| 2006/0220209 | A1 | 10/2006 | Karnezos et al. | |
| 2006/0290376 | A1 | 12/2006 | Kao | |

* cited by examiner

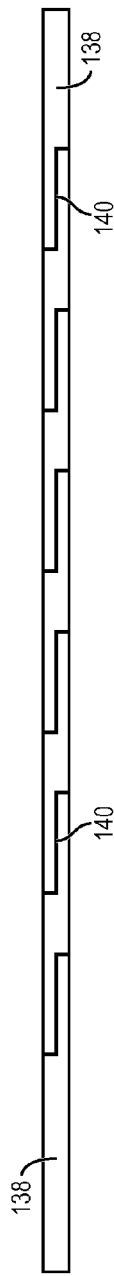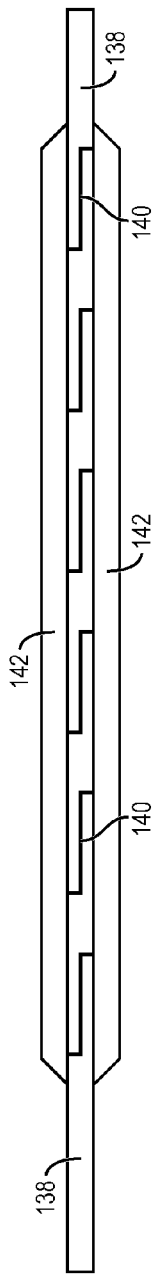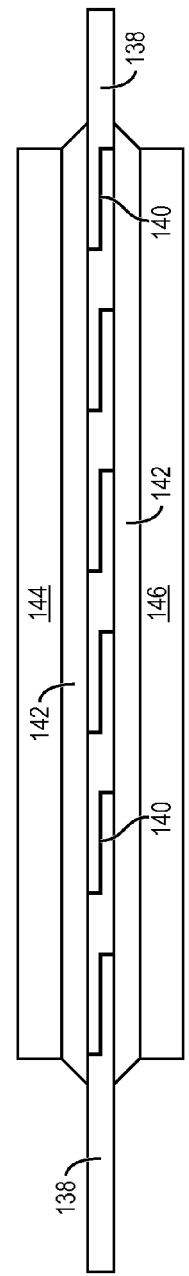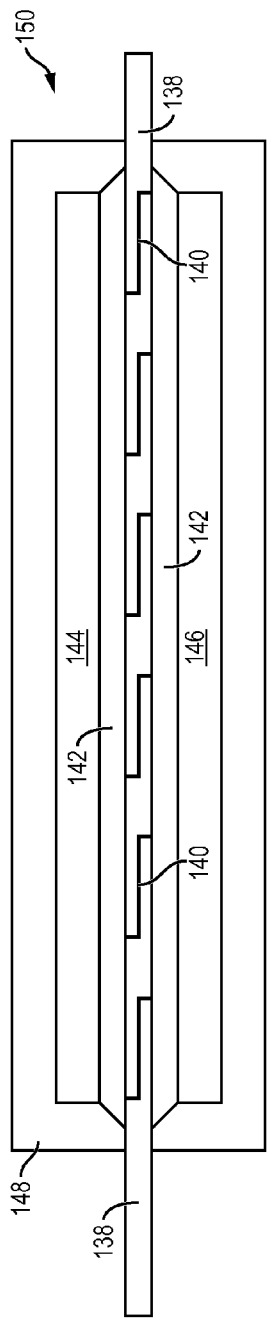

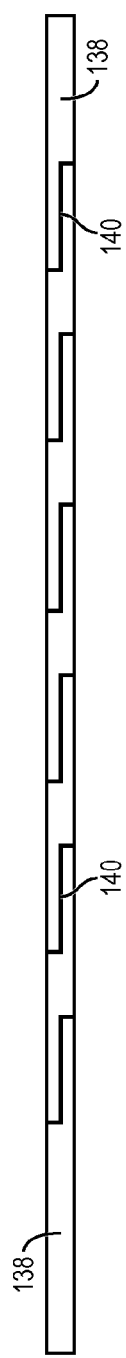
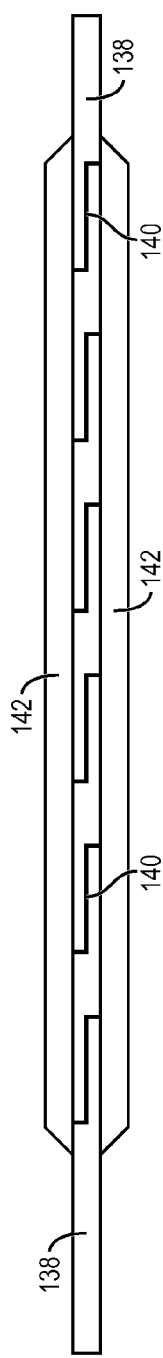
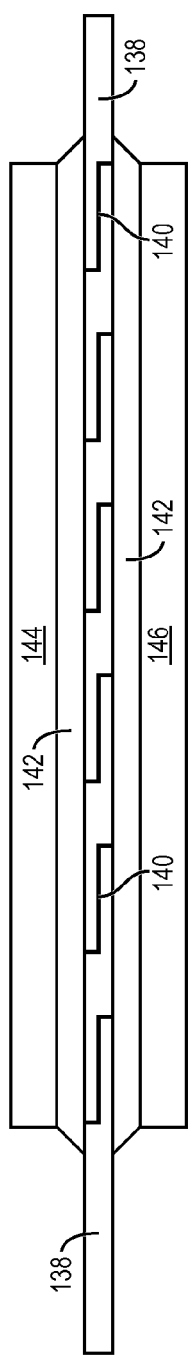
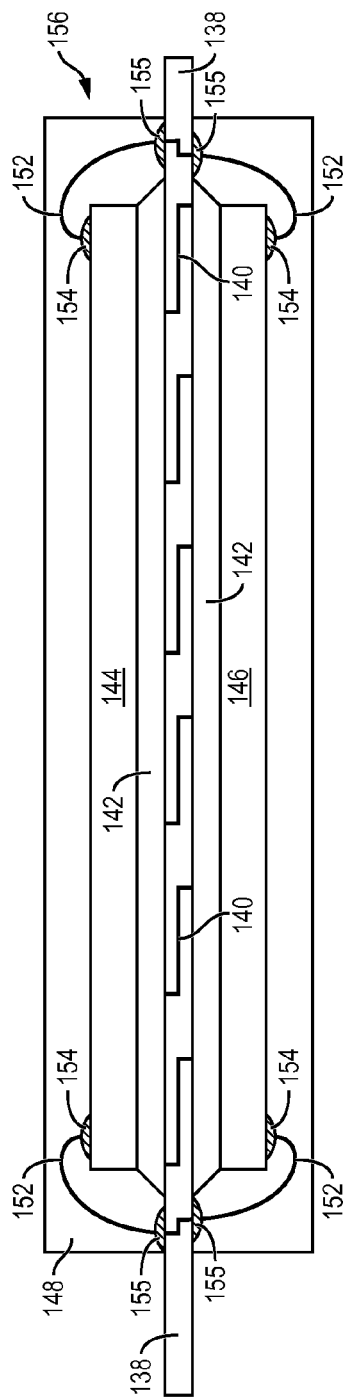
FIG. 8a
FIG. 8b
FIG. 8c
FIG. 8d

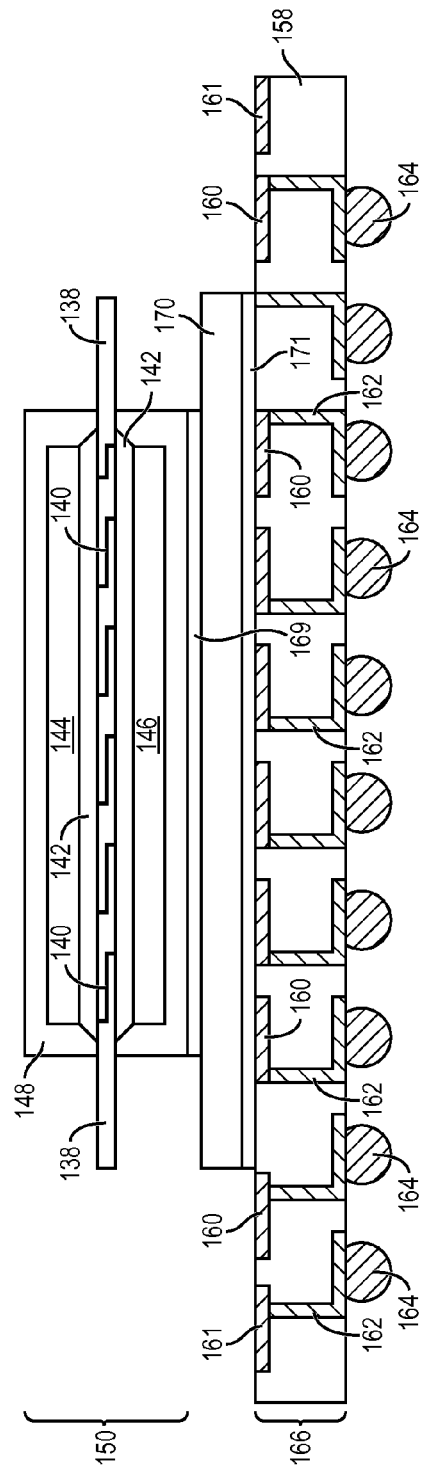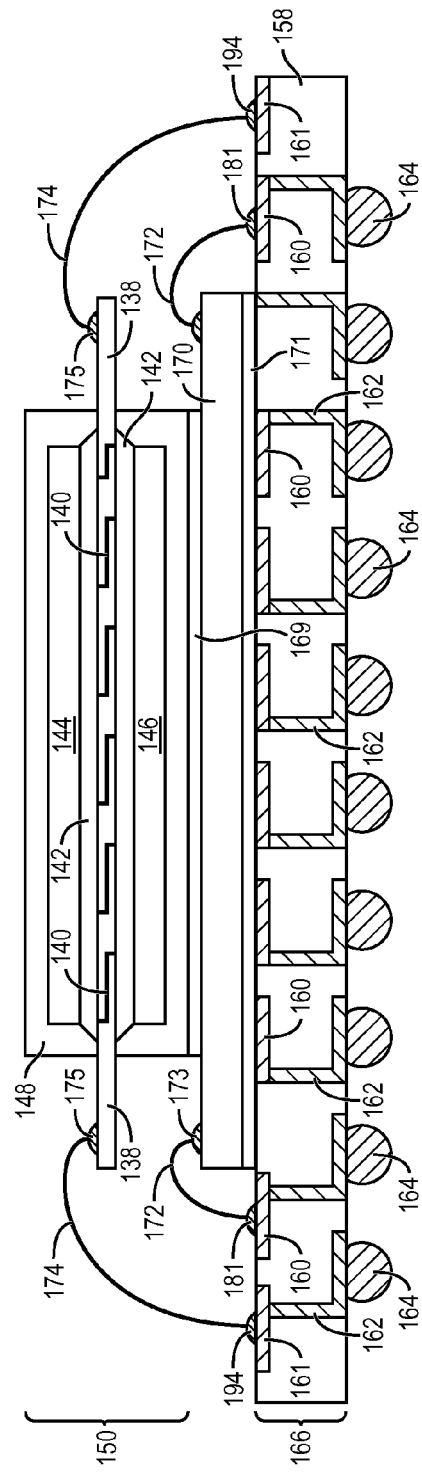

STACKABLE PACKAGE BY USING INTERNAL STACKING MODULES

CLAIM TO DOMESTIC PRIORITY

The present application is a continuation of U.S. patent application Ser. No. 12/882,748, now abandoned, filed Sep. 15, 2010, which is a continuation-in-part of U.S. application Ser. No. 11/771,086, now U.S. Pat. No. 7,800,211, filed Jun. 29, 2007, which applications are incorporated herein by reference.

FIELD OF THE INVENTION

The present invention relates in general to semiconductor devices and, more particularly, a stackable semiconductor package using double side mold for internal stacking modules.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

The package has external metal contacts for transferring electrical signals into and out of the die. The die has a number of bond pads, which are connected to the external contacts of the package by wire bonds. Wire bonding provides an electrical interconnect between the active surface of the die and bond sites on a leadframe or bond fingers on the substrate, which in turn provide connectivity to other circuitry external to the semiconductor package.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials. Numerous package approaches have made use of multiple integrated circuit die or package-in-package (PiP) structures. Other approaches use package level stacking or package-on-package (PoP) arrangements. Both approaches involve the stacking of two or more devices or packages within a package.

FIG. 1 illustrates one known PiP structure. Semiconductor die 12 is attached to substrate 14 with die attach adhesive 16. Bond wires 18 make electrical contact between bond pads on semiconductor die 12 and bumps 20 to transfer electrical signals into and out of the package. Similarly, semiconductor die 22 is attached to substrate 24 with die attach adhesive 26. Bond wires 28 make electrical contact between bond pads on semiconductor die 22 and bumps 20 to transfer electrical signals into and out of the package. An encapsulant 32 seals semiconductor die 22 to form internal stacking module (ISM) 34. A dummy spacer 30 separates semiconductor die 12 and ISM 34, and provides structural support for the package. Adhesive 38 secures dummy spacer 30 to semiconductor die 12 and ISM 34. FIG. 2 shows a top view of an ISM with package test pads 42 and bond finger pads 44.

There is an ever-increasing demand for semiconductor devices having more capability. The semiconductor package must be able to accommodate more semiconductor devices, i.e., greater device packing density, within the package. The aforedescribed dummy spacer requires significant space and places demands on the headroom of the package. The dummy spacer reduces the space available for semiconductor device and thereby decreases the packing density of the PiP structure.

SUMMARY OF THE INVENTION

In view of the ever-increasing need to save costs and improve efficiencies, a need exists for an integrated circuit (IC) package-to-package stacking system that provides low-cost manufacturing, improved yield, reduces the package size and dimensions, increases semiconductor device packing density, and provides flexible stacking and integration configurations for the semiconductor die.

Accordingly, in one embodiment, the invention is a method of making a semiconductor device comprising providing a substrate, disposing a first semiconductor die over the substrate, and providing a first DSM ISM by providing a platform including conductive traces formed in the platform, disposing a second semiconductor die over a first surface of the platform, disposing a third semiconductor die over a second surface of the platform opposite the first surface of the platform, and depositing a first encapsulant over the second semiconductor die and third semiconductor die. The method further includes the steps of disposing the first DSM ISM over the first semiconductor die, forming a first bond wire between the platform and substrate, and depositing a second encapsulant over the first DSM ISM, first bond wire, and substrate.

In another embodiment, the invention is a method of making a semiconductor device comprising the steps of providing a substrate, and providing a first DSM ISM by providing a platform, disposing a first semiconductor die over a first surface of the platform, disposing a second semiconductor die over a second surface of the platform opposite the first surface of the platform, and depositing a first encapsulant over the first semiconductor die and second semiconductor die. The method further includes the steps of disposing the first DSM ISM over the substrate, forming a first bond wire between the platform and substrate, and depositing a second encapsulant over the first DSM ISM, first bond wire, and substrate.

In another embodiment, the invention is a method of making a semiconductor device comprising the steps of providing a substrate, providing a first DSM ISM, disposing the first DSM ISM over the substrate, forming a first bond wire between the first DSM ISM and substrate, and depositing a first encapsulant over the first DSM ISM, first bond wire, and substrate.

In another embodiment, the invention is a semiconductor device comprising a substrate and first DSM ISM disposed over the substrate. A first bond wire is formed between the first DSM ISM and substrate. A first encapsulant is deposited over the first DSM ISM, first bond wire, and substrate.

BRIEF DESCRIPTION OF THE DRAWINGS

FIGS. 7a-7d illustrate cross-sectional views of an example process for forming a DSM ISM;

FIGS. 8a-8d illustrate cross-sectional views of another example process for forming a DSM ISM;

FIGS. 10a-10d illustrate cross-sectional views of an example process for forming a PiP structure using a single DSM ISM;

DETAILED DESCRIPTION OF THE DRAWINGS

Figure 1:
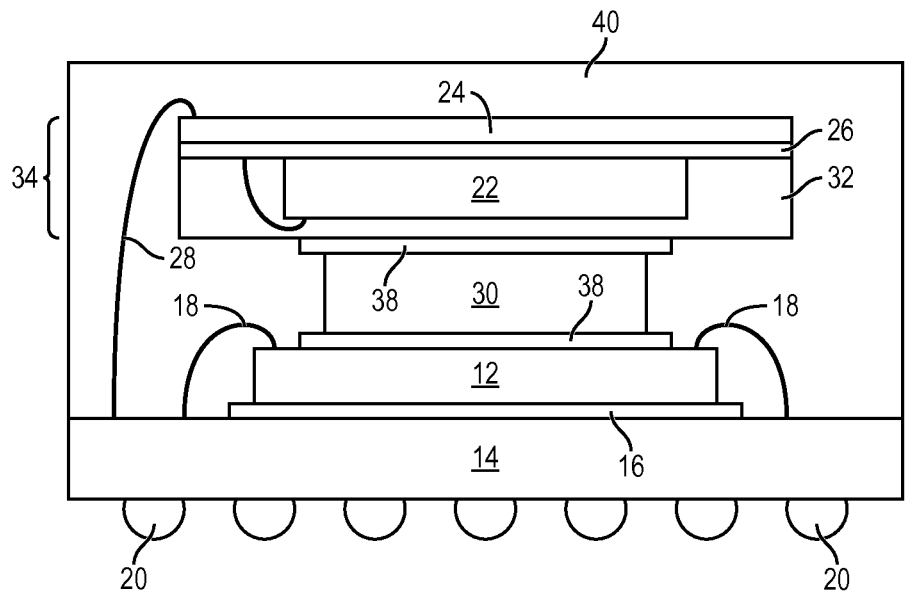
FIG. 1 illustrates a prior art package-in-package structure containing semiconductor die and ISM separated by a dummy spacer.
Figure 2:
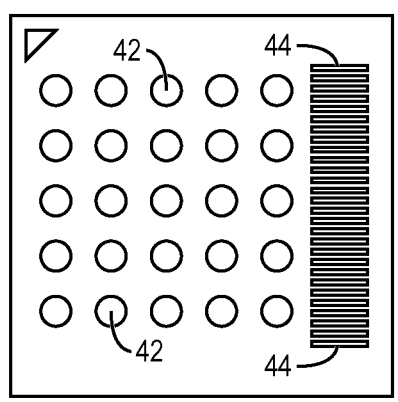
FIG. 2 illustrates a top view of a prior art ISM with package test pads and bond finger pads.

One or more example embodiments are described in the following description with reference to the Figures, in which like numerals represent the same or similar elements. The embodiments are described in terms of the best mode for achieving the invention's objectives. However, it will be appreciated by those skilled in the art that it is intended to cover alternatives, modifications, and equivalents as may be included within the spirit and scope of the invention as defined by the appended claims and/or equivalents as may be supported by the following disclosure and drawings.

As used herein, the term "horizontal" is a plane parallel to the plane or surface of the outer leads, regardless of their orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane. The term "processing" includes deposition of material or photoresist, patterning, exposure, development, etching, cleaning, and/or removal of the material or photoresist as required in forming a described structure.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Layers of materials with different electrical properties form active and passive components. The layers may be formed by a variety of deposition techniques determined, in part, by the type of material being deposited. For example, thin film deposition may involve chemical vapor deposition (CVD), physical vapor deposition (PVD), electrolytic plating, and electroless plating processes. Generally, each layer is patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding compound is deposited over the package to provide physical support and electrical isolation. The finished package is then inserted into an electrical system and the functionality of the semiconductor device is made available to the other system components.

Figure 3:
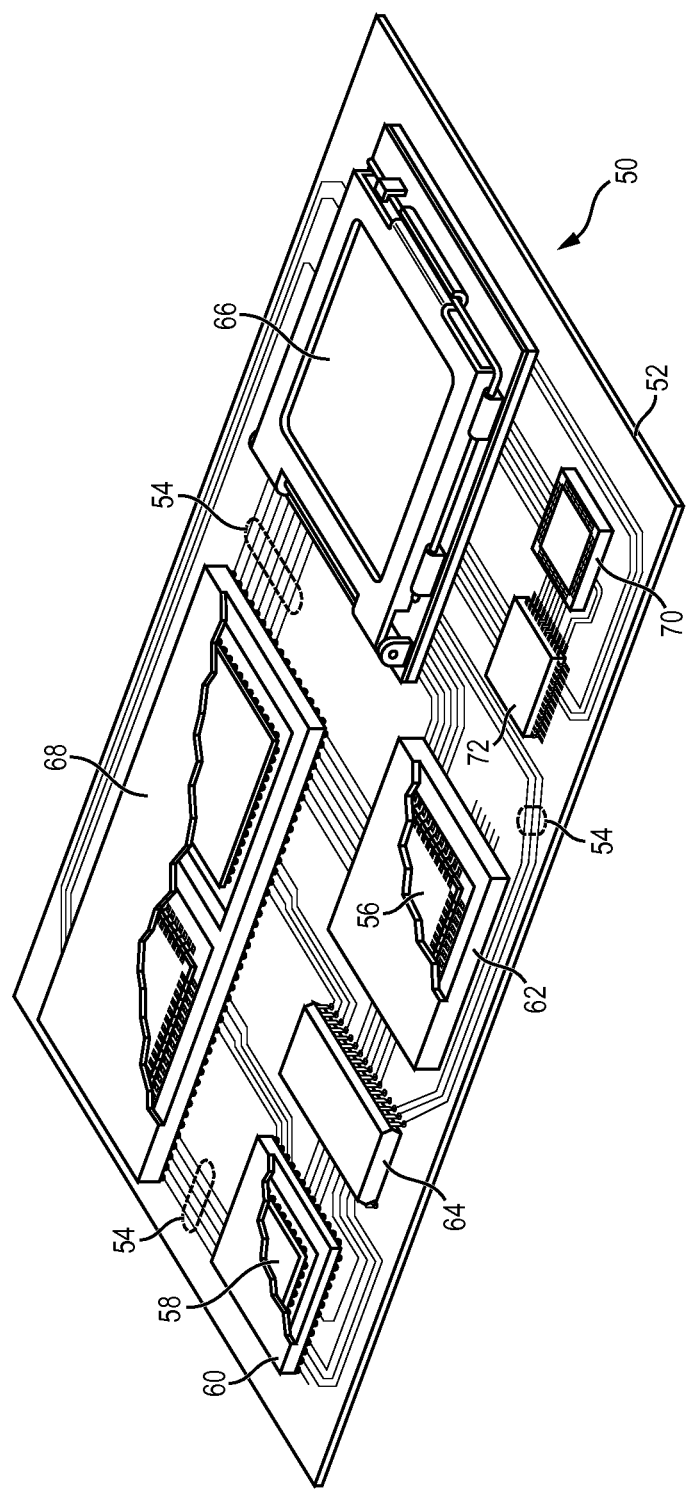
FIG. 3 illustrates a printed circuit board (PCB) with different types of packages mounted to its surface.

FIG. 3 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. Electronic device 50 may be a stand-alone system that uses the semiconductor packages to perform one or more electrical functions. Alternatively, electronic device 50 may be a subcomponent of a larger system. For example, electronic device 50 may be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASICs), logic circuits, analog circuits, RF circuits, discrete devices, or other semiconductor die or electrical components. The miniaturization and the weight reduction are essential for these products to be accepted by the market. The distance between semiconductor devices must be decreased to achieve higher density.

In FIG. 3, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 4A:
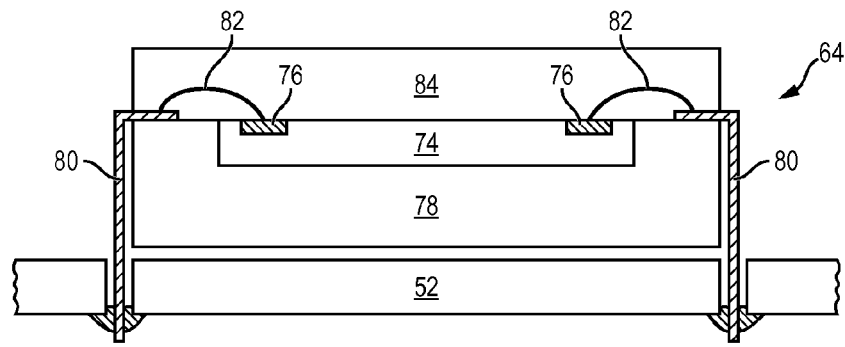
FIGS. 4a-4c illustrate further detail of the representative semiconductor packages mounted to the PCB of FIG. 3.
Figure 4B:
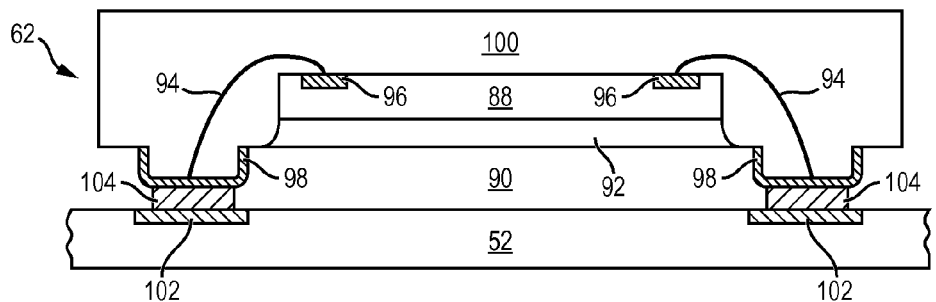
Figure 4C:
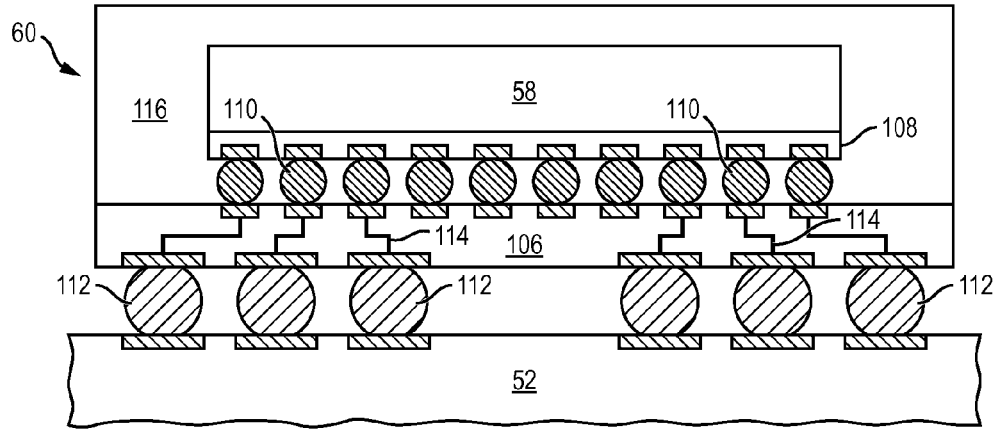

FIGS. 4*a*-4*c* illustrate further details of the representative semiconductor packages mounted to the PCB 52 of FIG. 3. FIG. 4*a* illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 4*b* illustrates further detail of BCC 62 mounted on PCB 52. Semiconductor die 88 is mounted over carrier 90 using an underfill or epoxy-resin adhesive material 92. Wire bonds 94 provide first level packaging interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 4c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a 4BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 5A:
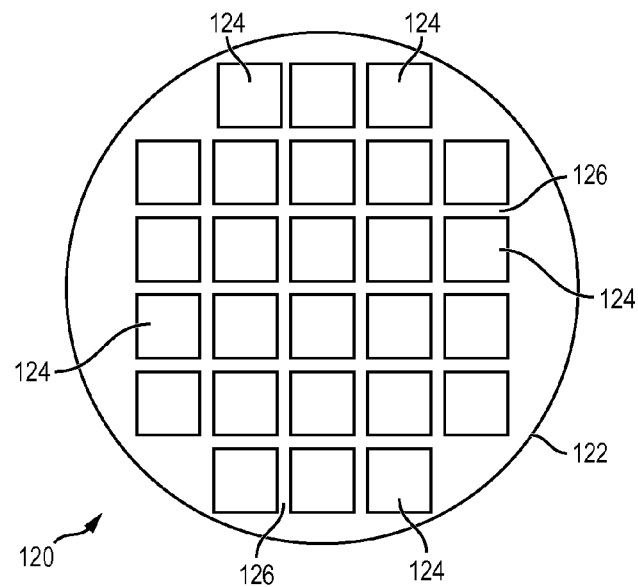
FIGS. 5a-5c illustrate a semiconductor wafer with a plurality of semiconductor die separated by saw streets.
Figure 5B:
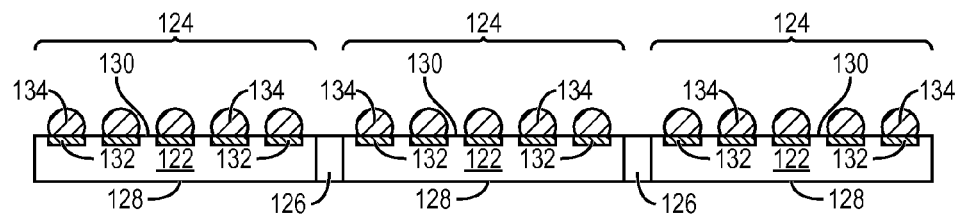
Figure 5C:
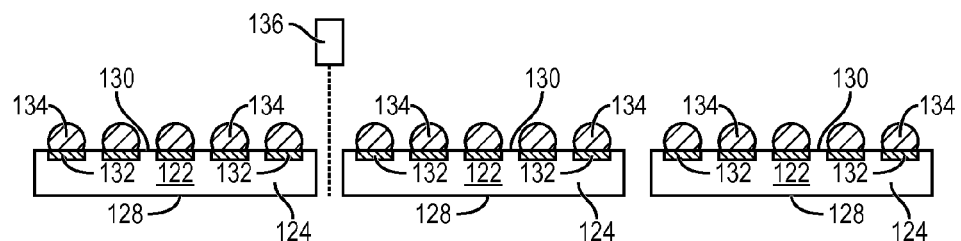

FIGS. 5a-5c illustrate a semiconductor wafer 120 with a plurality of semiconductor die 124 separated by saw streets 126. FIG. 5a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by saw streets 126, as described above.

FIG. 5b shows a cross-sectional view of a portion of semiconductor wafer 120. Each semiconductor die 124 has a back surface 128 and an active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPD), such as inductors, capacitors, and resistors, for RF signal processing.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Bumps 134 are formed on contact pads 132. In one embodiment, semiconductor die 124 is a flip chip type semiconductor die.

In FIG. 5c, semiconductor wafer 120 is singulated through saw street 126 using saw blade or laser cutting tool 136 into individual semiconductor die 124. Each semiconductor die 124 has bumps 134 formed over contact pads 132.

Figure 6A:
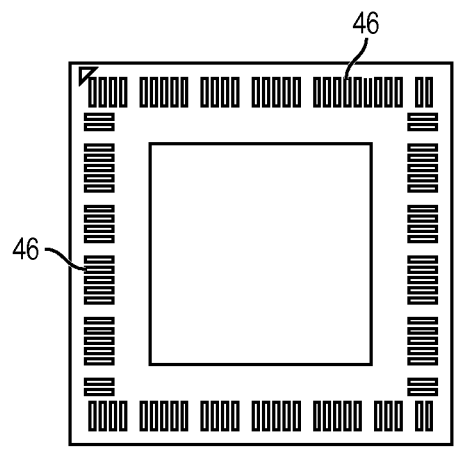
FIGS. 6a-6b illustrate top and bottom views of a DSM ISM with bond finger pads and package test pads.
Figure 6B:
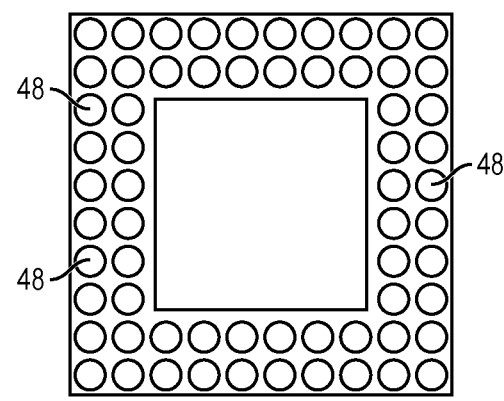

FIGS. 6a-6b illustrate top and bottom views, respectively, of a double side mold (DSM) ISM with bond finger pads 46 and package test pads 48. As shown in FIG. 6a, the bond finger pads 46 are disposed around a perimeter on top of the DSM ISM. As shown in FIG. 6b, the package test pads 48 are disposed in a double row configuration around a perimeter on the bottom of the DSM ISM.

FIGS. 7a-7d illustrate cross-sectional views of an example process for forming a first DSM ISM 150. As will be disclosed in further detail below, the DSM ISM 150 may be used as a component in a variety of different semiconductor packages.

Referring to FIG. 7a, a platform 138 is provided. In some embodiments, platform 138 may be a substrate composed of a base substrate material such as silicon, germanium, gallium arsenide, indium phosphide, or silicon carbide, for structural support. Alternatively, platform 138 may be a printed circuit board (PCB).

Platform 138 includes metal traces 140 running through the platform. Metal traces 140 may be composed of one or more of the conductive materials Al, Cu, Sn, Ni, nickel vanadium (NiV), Au, Ag, titanium (Ti), tungsten (W), or other suitable electrically conductive material. Metal traces 140 may include conductive layers (not shown) disposed on the surfaces of the platform 138, conductive vias that are arranged substantially vertically within the platform, and conductive redistribution layers (RDLs) that are arranged substantially horizontally inside the platform.

The conductive layers on the surface of the platform 138 and the RDLs disposed within the platform may be patterned and deposited using electrolytic plating, electroless plating, sputtering, PVD, CVD, or other suitable metal deposition process. The conductive vias that are disposed within the platform may be formed by using a laser drilling, DRIE etching, or other etching process with typically IR alignment through the platform 138 to form through-silicon vias (TSVs). The TSVs are then subsequently filled with Al, Cu, Sn, Ni, NiV, Au, Ag, Ti, W, or other suitable electrically conductive material using PVD, CVD, electrolytic plating, electroless plating process, or other suitable metal deposition process. Alternatively, a plurality of stud bumps or solder balls may be formed within the TSVs. Thus, the metal traces 140 provide an electrical path from one side of the platform 138 to the other side, and may electrically connect components disposed on one side of the platform 138 to components disposed on the other, opposite side of the platform.

FIG. 7b illustrates the subprocess of applying an adhesive layer 142, such as a thermal epoxy, to both sides of the platform 138. A thickness of the adhesive layer 142 may be exaggerated for clarity. Next, in FIG. 7c, semiconductor die 144 and 146 are provided, and active surfaces of the semiconductor die are affixed to the top and bottom, respectively, of the platform 138 using the adhesive layer 142. In some embodiments, semiconductor die 144 and 146 may be memory devices.

While not shown in FIG. 7c, semiconductor die 144, 146 also include conductive pads and bumps, similar to the conductive pads 132 and bumps 134 formed on the active surfaces of the semiconductor die 124 of FIG. 5a-5c. In this manner, analog and/or digital circuits formed on the active surfaces of the semiconductor die 144, 146 may be electrically coupled to the metal traces 140 disposed on the platform 138. The semiconductor dies 144, 146 may also be electrically coupled to each other by the metal traces 140.

Next, as illustrated in FIG. 7d, a molding compound 148 is formed to partially enclose the platform 138 and to enclose the adhesive layer 142 and the semiconductor dies 144, 146. The molding compound 148 is formed around the platform 138 such that the platform protrudes from the side of the molding compound to some extent. As shown, molding compound 148 preferably covers and protects a region of platform 138 including metal traces 140, but it should be recognized that portions of the metal traces 140 on peripheral surfaces of the platform 138 may not be covered by the molding compound 148 in order to facilitate subsequent electrical interconnection processes.

Molding compound 148 includes a high resistivity material with a low loss tangent and matched coefficient of thermal expansion (CTE) such as polymer (resin) matrix composite with fillers to adjust its mechanical, thermal, and electrical properties. For example, the loss tangent is less than 0.01 at RF frequency. The molding compound 148 may be deposited around semiconductor die 144, 146, platform 138, and adhesive layers 142 a paste printing, compressive molding, transfer molding, liquid encapsulant molding, vacuum lamination, spin coating, or other suitable applicator. In one embodiment, molding compound 148 is deposited using film-assisted molding process.

Molding compound 148 may be a polymer composite material, such as epoxy resin with filler, epoxy acrylate with filler, or polymer with proper filler. Molding compound 148 is optionally grinded or etched to a desired thickness. Depending upon the application, after grinding of molding compound 148, a top surface of semiconductor die 144 and/or a bottom surface of semiconductor die 146 may alternatively be exposed. Molding compound 148 is non-conductive and environmentally protects the semiconductor die 144, 146 from external elements and contaminants.

FIGS. 8a-8d illustrate cross-sectional views of an example process for forming a second DSM ISM 156. As will be disclosed in further detail below, the DSM ISM 156 may be used as a component in a variety of different semiconductor packages.

Referring to FIG. 8a, a platform 138 is provided. In some embodiments, platform 138 may be a substrate composed of a base substrate material such as silicon, germanium, gallium arsenide, indium phosphide, or silicon carbide, for structural support. Alternatively, platform 138 may be a printed circuit board (PCB).

Platform 138 includes metal traces 140 running through the platform. Metal traces 140 may be composed of one or more of the conductive materials Al, Cu, Sn, Ni, NiV, Au, Ag, Ti, W, or other suitable electrically conductive material. Metal traces 140 may include conductive layers (not shown) disposed on the surfaces of the platform 138, conductive vias that are arranged substantially vertically within the platform, and conductive redistribution layers (RDLs) that are arranged substantially horizontally inside the platform.

The conductive layers on the surface of the platform 138 and the RDLs disposed within the platform may be patterned and deposited using electrolytic plating, electroless plating, sputtering, PVD, CVD, or other suitable metal deposition process. The conductive vias that are disposed within the platform 138 may be formed by using a laser drilling, DRIE etching, or other etching process with typically IR alignment through the platform 138 to form through-silicon vias (TSVs). The TSVs are then subsequently filled with Al, Cu, Sn, Ni, NiV, Au, Ag, Ti, W, or other suitable electrically conductive material using PVD, CVD, electrolytic plating, electroless plating process, or other suitable metal deposition process. Alternatively, a plurality of stud bumps or solder balls may be formed within the TSVs. Thus, the metal traces 140 provide an electrical path from one side of the platform 138 to the other side, and may electrically connect components disposed on one side of the platform 138 to components disposed on the other, opposite side of the platform.

FIG. 8b illustrates the subprocess of applying an adhesive layer 142, such as a thermal epoxy, to both sides of the platform 138. A thickness of the adhesive layer 142 may be exaggerated for clarity. Next, in FIG. 8c, semiconductor die 144 and 146 are provided, and active surfaces of the semiconductor die are affixed to the top and bottom, respectively, of the platform 138 using the adhesive layer 142. In some embodiments, semiconductor die 144 and 146 may be memory devices.

Next, bond pads 154 are formed on top and bottom surfaces of the semiconductor die 144, 146, respectively, to electrically couple with the semiconductor die. Similarly, bond pads 155 are formed on top and bottom surfaces of the platform 138 to electrically coupled with the metal traces 140. Bond pads 154 and 155 are made with a conductive material, such as Al, Cu, Sn, Ni, Au, Ag, or combinations thereof.

Then, bond wires 152 are attached to the bond pads 154 and 155 to electrically connect a bond pad 154 to a corresponding bond pad 155. The bond wires 152 are formed using a capillary bonding tool, a support for the device to be wire-bonded, a source of heat, a source and transducer to impart ultrasound vibration to the capillary bonding tool, and automated control for coordinating the movement and function of these machinery elements. Bond wires 152 may be made of aluminum (Al), gold (Au), or some other suitable metal or metal alloy.

Finally, a molding compound 148 is formed as shown in FIG. 8d, resulting in DSM ISM 156. Similar to DSM ISM 150 of FIG. 7d, molding compound 148 is formed around platform 138 such that the platform protrudes from a side of the molding compound to some extent. As shown, molding compound 148 preferably covers and protects a region of platform 138 including metal traces 140, bond wires 152, and bond pads 154, but it should be recognized that portions of the metal traces 140 on peripheral surfaces of the platform 138 may not be covered by molding compound 148 in order to facilitate subsequent electrical interconnection processes.

The molding compound 148 may be deposited around semiconductor die 144, 146, platform 138, bond pads 154, bond pads 156, and adhesive layers 142 using a paste printing, compressive molding, transfer molding, liquid encapsulant molding, vacuum lamination, spin coating, or other suitable applicator. In one embodiment, molding compound 148 is deposited using film-assisted molding process.

Molding compound 148 may be polymer composite material, such as epoxy resin with filler, epoxy acrylate with filler, or polymer with proper filler. Molding compound 148 is non-conductive and environmentally protects the semiconductor device from external elements and contaminants.

FIGS. 9a-9d illustrate cross-sectional views of an example process for forming a circuit carrier 166. Beginning with FIG. 9a, a semiconductor wafer or chip carrier substrate 158 is provided. Substrate 158 provides structural support and contains a base substrate material, such as silicon, germanium, gallium arsenide, indium phosphide, or silicon carbide, for example. In alternative embodiments, a printed circuit board may be used in lieu of substrate 158.

Figure 9A:
FIGS. 9a-9d illustrate cross-sectional views of an example process for forming a circuit carrier.
Figure 9B:
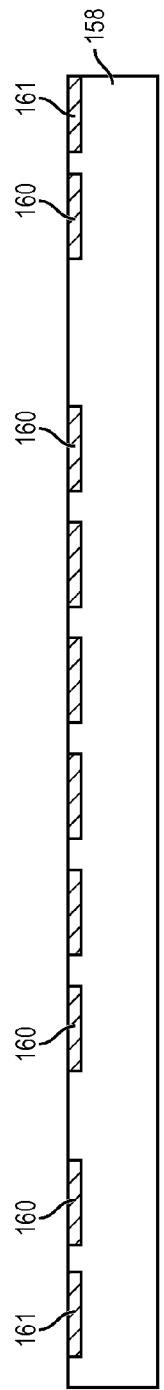

Next, in FIG. 9b, the surface of the substrate 158 is etched using a suitable mechanical and/or chemical etching process to form a first plurality of openings in the substrate. Then, one or more conductive materials are deposited in the openings on the chip carrier substrate 158 using a plasma vapor deposition (PVD) process, a chemical vapor deposition (CVD) process, an electrolytic plating process, an electroless plating process, or some other suitable metal deposition process to form bond pads 160 and 161. The one or more conductive materials may include, for example, Al, Cu, Sn, Ni, Au, Ag, Ti, tungsten (W), and conductive poly-silicon.

Figure 9C:
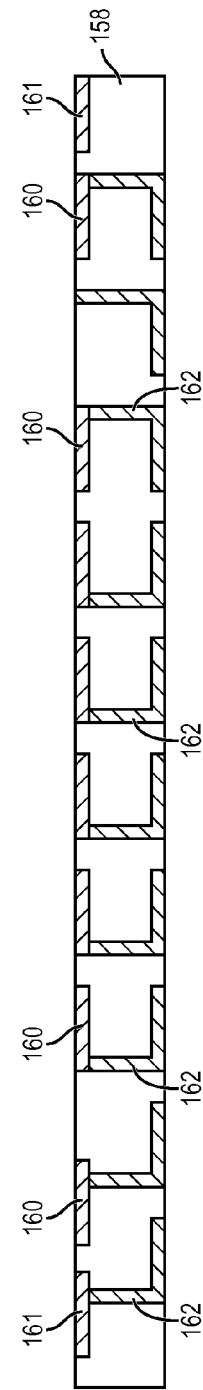

Next, in FIG. 9c, the other side of the substrate 158 opposite the bond pads 160 and 161 is etched to form a second plurality of openings on the substrate. Additionally, a plurality of through-silicon vias (TSVs) is formed through substrate 158 using a laser drilling, DRIE etching, or other etching process with typically IR alignment. The TSVs and second openings are then filled with a conductive material using PVD, CVD, electrolytic plating, electroless plating process, or some other suitable metal deposition process to form conductive vias 162, which are each electrically connected to one of the bond pads 160 or 161. The conductive vias 162 are composed of one or more of Al, Cu, Sn, Ni, NiV, Au, Ag, Ti, W, or other suitable electrically conductive material.

Figure 9D:
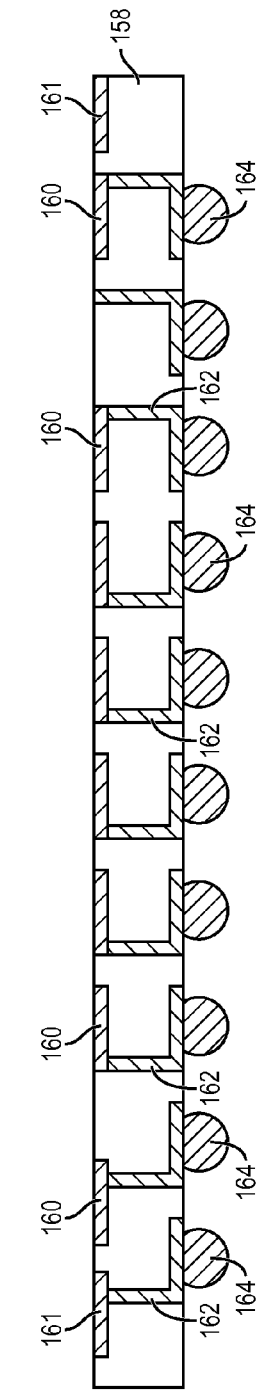

Lastly, in FIG. 9d, a plurality of bumps 164 is attached to the conductive vias 162 to form circuit carrier 166. It will be appreciated that the number and relative arrangement of bond pads 160 and 161, conductive vias 162, and bumps 164 to one another may vary depending on the overall design of the package.

To form the bumps 164, an electrically conductive bump material is deposited over the underside of substrate 158 using an evaporation, electrolytic plating, electroless plating, ball drop, or screen printing process. The electrically conductive bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder.

The bump material is bonded to conductive vias 162 using a suitable attachment or bonding process. In one embodiment, the bump material is reflowed by heating the material above its melting point to form spherical balls or bumps 164. In some applications, bumps 164 are reflowed a second time to improve electrical contact to conductive layer 102. The bumps can also be compression bonded to conductive vias 162. Bumps 164 represent but one type of interconnect structure that can be formed. The interconnect structure can also use bond wires, conductive paste, stud bump, micro bump, or other electrical interconnect.

Figure 10A:
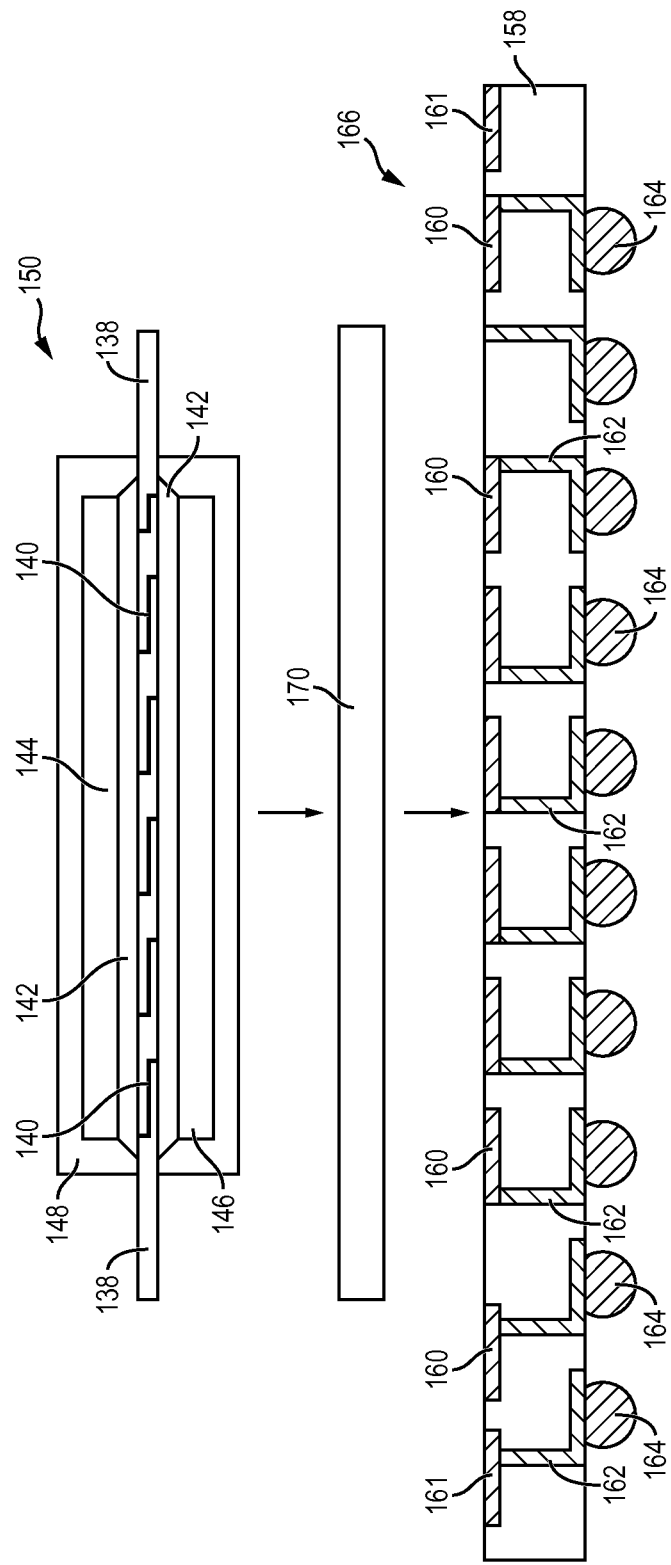

FIGS. 10a-10d illustrate cross-sectional views of an example process for forming a PiP structure 178 (FIG. 10d) using a single DSM ISM 150. FIG. 10a, which is an exploded view, illustrates how some components of the PiP structure 178 are assembled relative to each other. A circuit carrier 166, fabricated as described above with reference to FIGS. 9a-9d, is arranged at the bottom of the PiP structure 178. DSM ISM 150, fabricated as described above with reference to FIGS. 7a-7d, is arranged near the top of the PiP structure 178. A semiconductor die 170 is disposed between the chip carrier 166 and the DSM ISM 150.

Referring to FIG. 10b, semiconductor die 170 is attached to the chip carrier 166 by bonding it to an upper surface of chip carrier 166 with an adhesive layer 171. Adhesive layer 171 may be, for example, a thermal epoxy. Similarly, molding compound 148 of DSM ISM 150 is attached to semiconductor die 170 and is in physical contact with the semiconductor die by way of adhesive layer 169 to reduce headroom requirements and to increase packing density. Like adhesive layer 171, adhesive layer 169 may be, for example, a thermal epoxy.

Next, referring to FIG. 10c, bond pads 173 are formed on a top surface of the semiconductor die 170 to electrically couple with the semiconductor die. Similarly, bond pads 175 are formed on a top surface of the platform 138 to electrically couple with the semiconductor die 144, 146 via the metal traces 140. Similarly, bond pads 181 and 194 are formed on bond pads 160 and 161, respectively, to electrically couple with the bumps 164. Bond pads 173, 175, 181, and 194 are made with a conductive material, such as Al, Cu, Sn, Ni, Au, Ag, or combinations thereof.

Next, bond wires 172 are formed to electrically couple the bond pads 173 to the bonds pads 181. Similarly, bond wires 174 are formed to electrically couple the bond pads 175 to the bond pads 194.

The bond wires 172, 174 are formed using a capillary bonding tool, a support for the device to be wire-bonded, a source of heat, a source and transducer to impart ultrasound vibration to the capillary bonding tool, and automated control for coordinating the movement and function of these machinery elements. Bond wires 172, 174 may be made of aluminum (Al), gold (Au), or some other suitable metal or metal alloy.

Thus, semiconductor die 170 is electrically connected to bond pads 160 on substrate 158 by way of bond wires 172. Likewise, the DSM ISM 150, which includes the semiconductor die 144, 146, is electrically connected to bond pads 161 on substrate 158 by way of bond wires 174. Bond pads 160 and 161 electrically connect through conductive vias 162 to bumps 164. The electrical signals transfer in and out through the bumps 164, conductive vias 162, bond pads 160, 161, 181, 194 bond wires 172, 174, and bond pads 173, 175 to the semiconductor die 144, 146, 170 within the PiP structure.

Figure 10D:
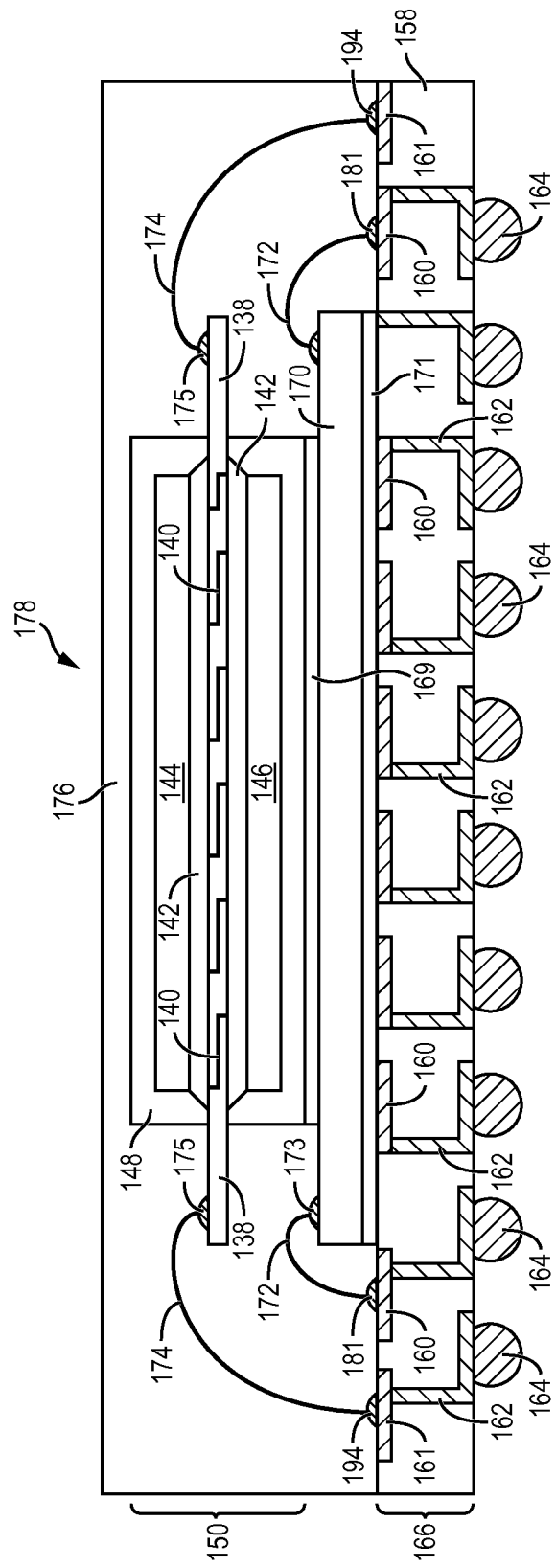

Referring to FIG. 10d, an encapsulating material or molding compound 176 is formed around the structure of FIG. 10c as shown to complete the PiP structure 178. The molding compound 176 may be deposited around DSM ISM 150, around bond pads 173, 175, around bond wires 172, 174, and around semiconductor die 170 to surround and cover them. The molding compound may be formed using a paste printing, compressive molding, transfer molding, liquid encapsulant molding, vacuum lamination, spin coating, or other suitable applicator. In one embodiment, molding compound 176 is deposited using a film-assisted molding process.

Molding compound 176 may be polymer composite material, such as epoxy resin with filler, epoxy acrylate with filler, or polymer with proper filler. Molding compound 176 is non-conductive and environmentally protects the semiconductor devices from external elements and contaminants.

Relative to the structure of FIG. 1, PiP structure 178 provides greater storage capacity of semiconductor die by eliminating a dummy spacer between the semiconductor die and ISM within the package. PiP structure 178 also reduces the height and size of the package as compared to the prior art and thereby increases an overall device packing density.

Figure 11A:
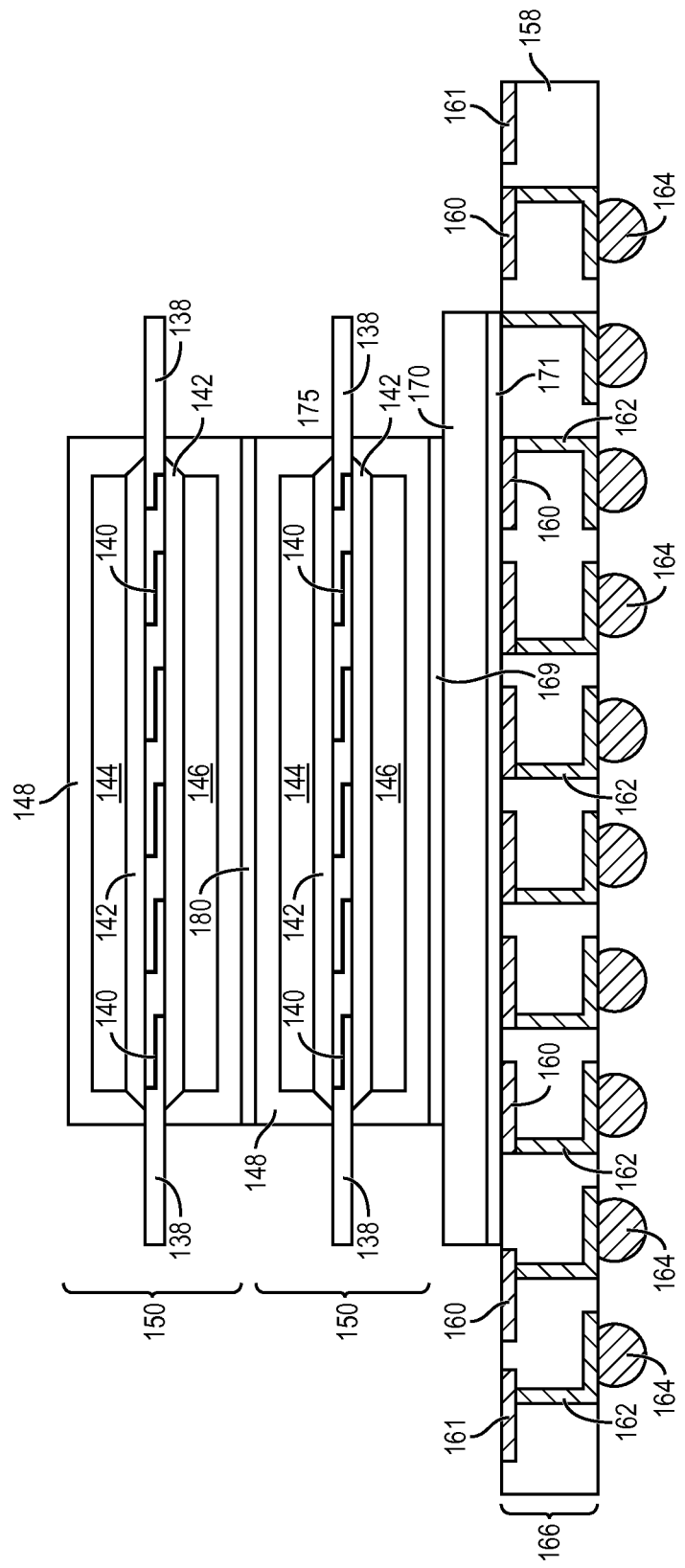
FIGS. 11a-11c illustrate cross-sectional views of an example process for forming a PiP structure using two stacked DSM ISMs.
Figure 11B:
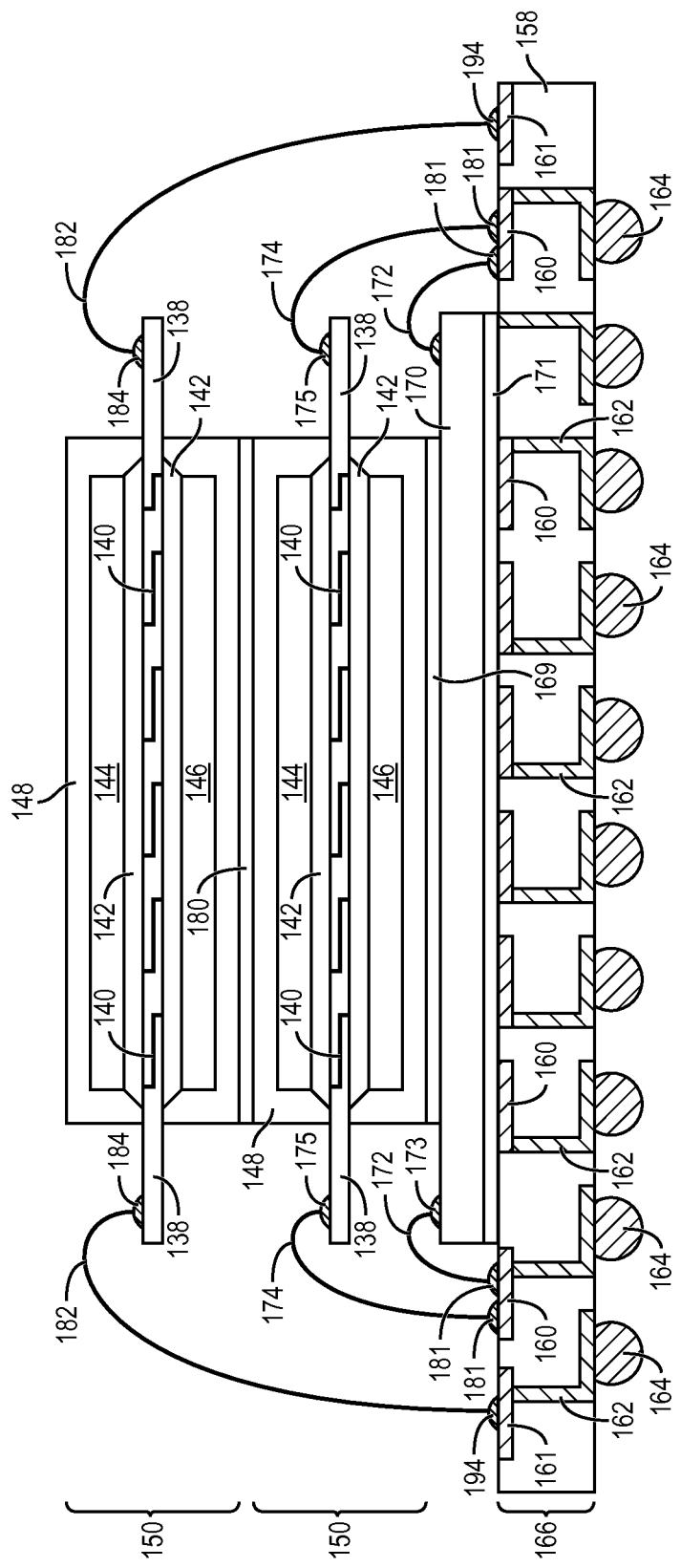
Figure 11C:
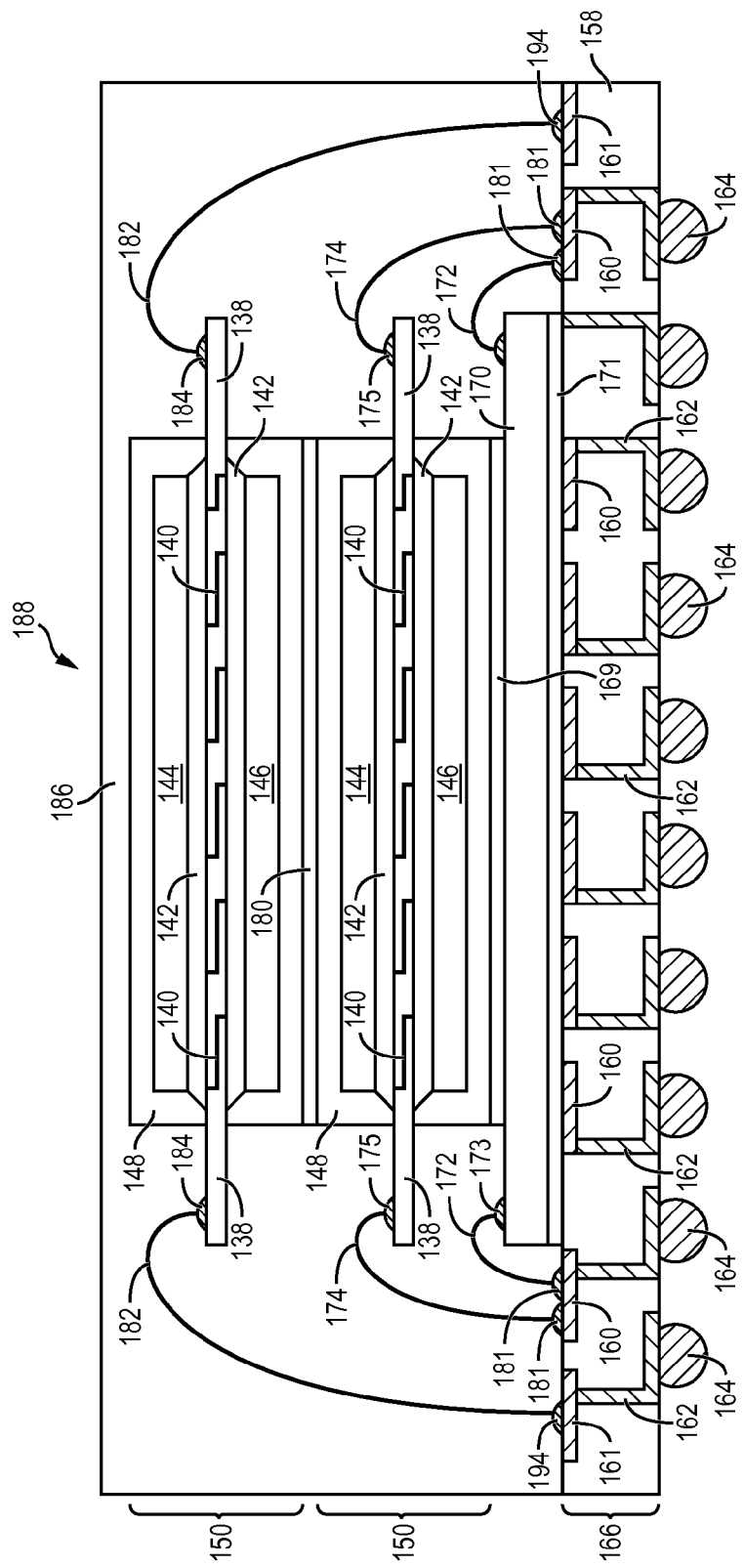

FIGS. 11a-11c illustrate cross-sectional views of an example process for forming another PiP structure 188 (FIG. 11c) using two DSM ISMs 150. The subprocesses illustrated by FIG. 11a begin after the subprocesses illustrated by FIG. 10a and FIG. 10b are complete. For the sake of brevity and conciseness, the subprocesses that were describe above with reference to FIGS. 10a and 10b will not be unnecessarily repeated here.

Beginning with FIG. 11a, a second DSM ISM 150 has been added relative to the structure illustrated in FIG. 10b. Molding compound 148 of the uppermost DSM ISM 150 is attached to the lowermost DSM ISM 150 and is in physical contact with the lowermost DSM ISM 150 by way of adhesive layer 180. Adhesive layer 180 may be, for example, a thermal epoxy. The uppermost DSM ISM 150 is directly attached to and is in physical contact with the lowermost DSM ISM 150 by way of adhesive 180 to reduce headroom requirements and to increase device packing density.

Now, referring to FIG. 11*b*, bond pads 173 are formed on a top surface of the semiconductor die 170 to electrically couple with the semiconductor die. Similarly, bond pads 175 and 184 are formed on top surfaces of the platforms 138 to electrically couple with the semiconductor die 144, 146 via the metal traces 140. Similarly, bond pads 181 and 194 are formed on bond pads 160 and 161, respectively, to electrically couple with the bumps 164. Bond pads 173, 175, 181, 184, 191 are made with a conductive material, such as Al, Cu, Sn, Ni, Au, Ag, or combinations thereof.

Next, bond wires 172 are formed to electrically couple the semiconductor die 170 to the bond pads 181. Similarly, bond wires 174 are formed to electrically couple the semiconductor die 144, 146 of the lowermost DSM ISM 150 to the bond pads 181 via the metal traces 140. Likewise, bond wires 182 are formed to electrically couple the semiconductor die 144, 146 of the uppermost DSM ISM 150 to the bond pads 194 via the metal traces 140.

The bond wires 172, 174, 182 are formed using a capillary bonding tool, a support for the device to be wire-bonded, a source of heat, a source and transducer to impart ultrasound vibration to the capillary bonding tool, and automated control for coordinating the movement and function of these machinery elements. Bond wires 172, 174, 182 may be made of aluminum (Al), gold (Au), or some other suitable metal or metal alloy.

Thus, semiconductor die 170 is electrically connected to bond pads 181 by way of bond wires 172. Similarly, the lowermost DSM ISM 150, which includes the semiconductor die 144, 146, is electrically connected to bond pads 181 by way of bond wires 174. Likewise, the uppermost DSM ISM 150, which includes the semiconductor die 144, 146, is electrically connected to bond pads 194 by way of bond wires 182. Bond pads 181 and 194 electrically connect through conductive vias 162 to bumps 164. The electrical signals transfer in and out through the bumps 164, conductive vias 162, bond pads 160, 161, 181, 194 bond wires 172, 174, 182 and bond pads 173, 175, 184 to the semiconductor die 144, 146, 170 within the PiP structure.

Next, referring to FIG. 11*c*, an encapsulating material or molding compound 186 is deposited over the two DSM ISMs 150 and semiconductor die 170 to achieve the PiP structure 188. The molding compound 176 may be deposited around both of the DSM ISMs 150, around bond pads 173, 175, 181, 184, 194 around bond wires 172, 174, 182 and around semiconductor die 170 to surround and cover them. The molding compound 186 may be formed using a paste printing, compressive molding, transfer molding, liquid encapsulant molding, vacuum lamination, spin coating, or other suitable applicator. In one embodiment, molding compound 186 is deposited using a film-assisted molding process.

Molding compound 186 may be polymer composite material, such as epoxy resin with filler, epoxy acrylate with filler, or polymer with proper filler. Molding compound 186 is non-conductive and environmentally protects the semiconductor devices from external elements and contaminants.

Relative to the PiP structure of FIG. 1, the PiP structure 188 provides greater storage capacity of semiconductor die by eliminating a dummy spacer between the semiconductor die and ISM within the package. The storage capacity of the PiP structure 188 is increased even further relative to FIG. 1 by stacking multiple DSM ISMs without a significant increase in vertical headroom. The PiP structure 188 reduces the height and size of the package and increases overall device packing density.

Figure 12:
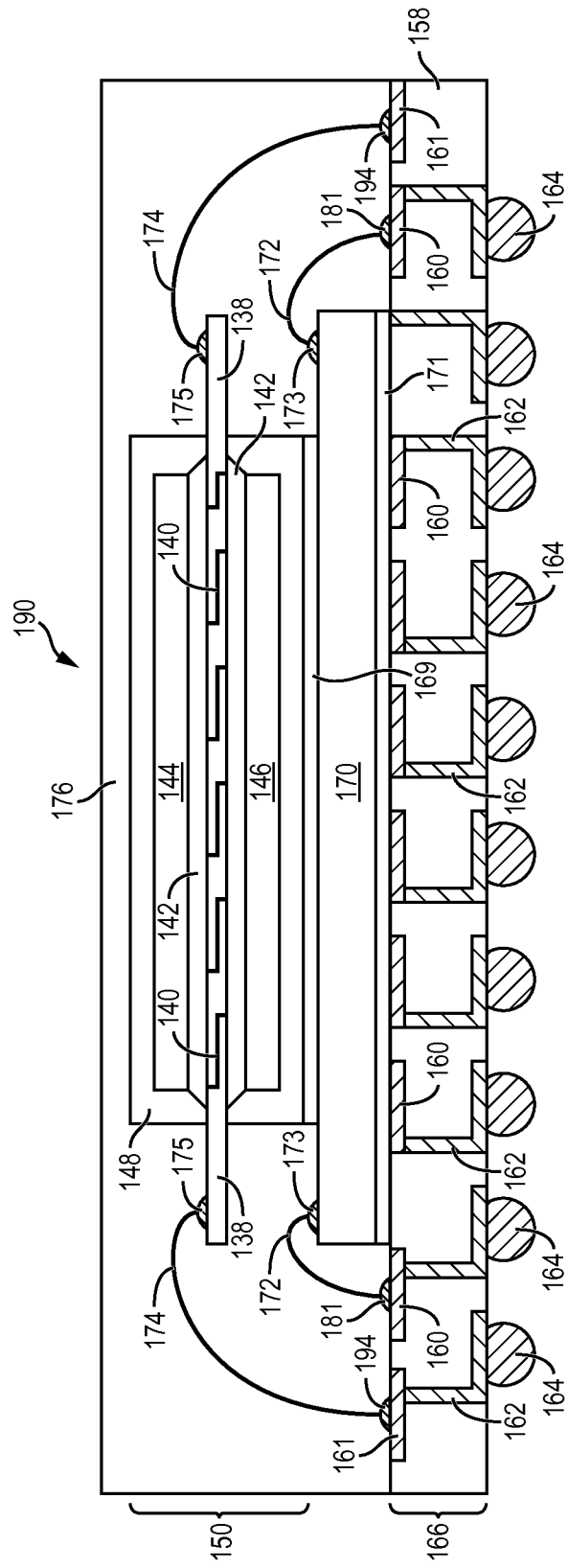
FIG. 12 illustrates a cross-sectional view of a PiP structure using a film on wire adhesive between the DSM ISM and semiconductor die.

FIG. 12 illustrates a cross-sectional view of a PiP structure 190. Example subprocesses used for fabricating the PiP structure 190 are similar to those used to fabricate the PiP structure 178 illustrated in FIGS. 10*a*-10*d*. Therefore, the following discussion places more emphasis on the differences between PiP structure 190 and PiP structure 178, and does not repetitively explain common features that were discussed above with reference to FIGS. 10*a*-10*d*.

Referring to FIG. 12, PiP structure 190 is shown with one DSM ISM 150 attached to semiconductor die 170 with adhesive layer 169. DSM ISM 150 is directly attached to and in physical contact with semiconductor 170 by way of adhesive layer 169 to reduce headroom requirements and to increase device packing density. Bond wires 172 and 174 are attached to the semiconductor die 170 and the platform 138, respectively, using the bonding pads 173 and 175. PiP structure 190 has bond pads 181 and 194 disposed on surfaces of the bond pads 160 and 161, respectively, to connect bond wires 172 and 174 to bond pads 160 and 161. In PiP structure 190, the electrical signals transfer in and out through the bumps 164, conductive vias 162, bond pads 181, 194, wire bonds 172, 174, and bond pads 173, 175, to the semiconductor die 144, 146, 170 within the PiP structure.

The PiP structure 190 provides greater storage capacity of semiconductor die by eliminating a dummy spacer between the semiconductor die and ISM within the package. The PiP structure 190 also reduces the height of the package and increases overall device packing density.

Figure 13:
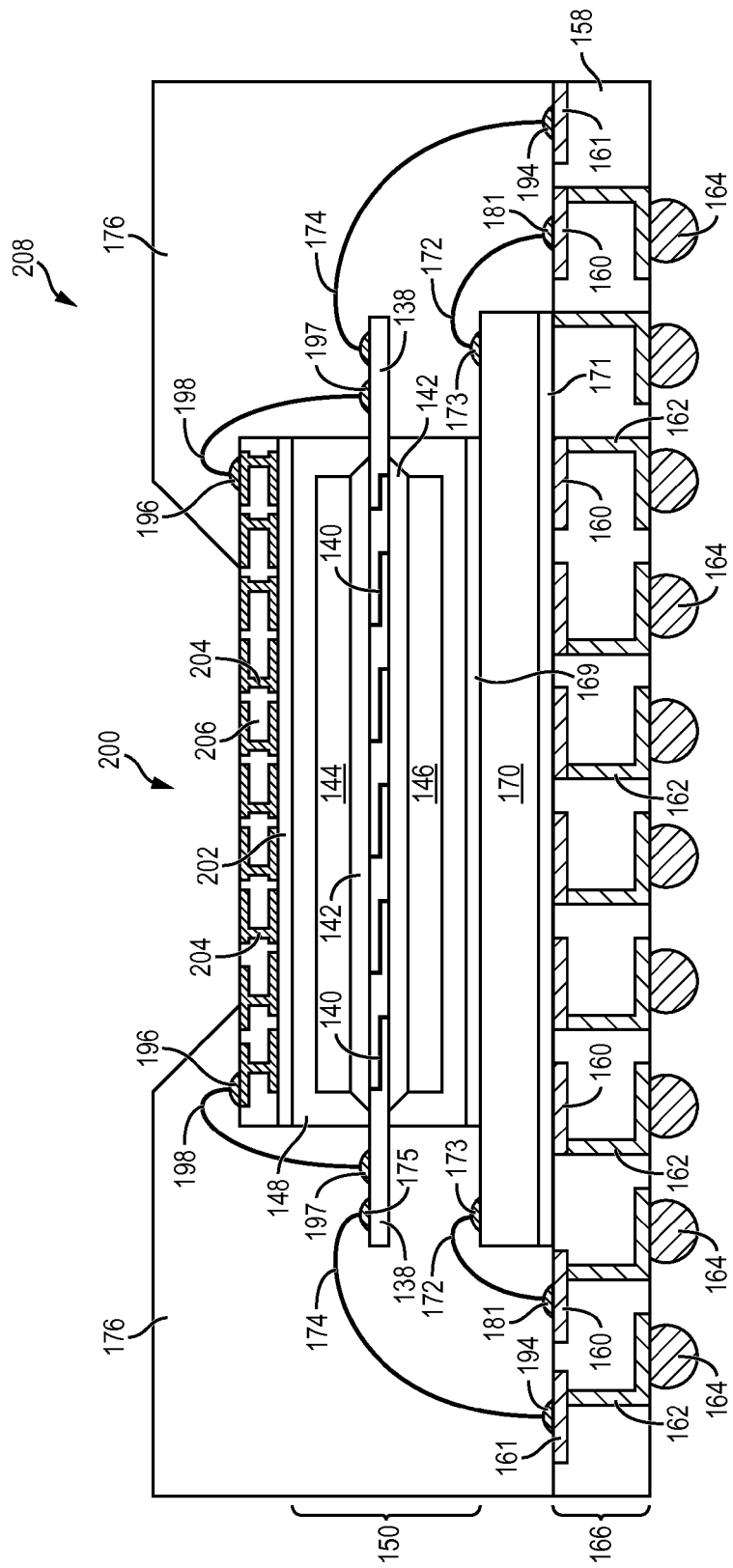
FIG. 13 illustrates a cross-sectional view of a PiP structure with exposed top mold area and using an interposer.

FIG. 13 illustrates a cross-sectional view of a PiP structure 208 with an exposed top mold area 200 and an interposer 206. Example subprocesses used for fabricating the PiP structure 208 are similar to those used to fabricate the PiP structure 190 that is illustrated in FIG. 12. Therefore, the following discussion places more emphasis on the differences between PiP structure 208 and PiP structure 190, and does not repetitively explain common features that were discussed above with reference to FIG. 12.

Referring to FIG. 13, an interposer 206 is disposed between a top surface of DSM ISM 150 and an exposed mold area 200 of molding compound 176. The interposer 206 contains electrical contacts 204 and is attached to DSM ISM 150 with adhesive 202. The interposer 206 has wire bond pads 196 for connecting wire bonds 198 to wire bond pads 197 on platform 138 of DSM ISM 150.

Relative to the PiP structure of FIG. 1, the PiP structure 208 provides greater storage capacity of semiconductor die by eliminating a dummy spacer between the semiconductor die and ISM within the package. The PiP structure 208 also reduces the height of the package and increases overall device packing density.

Figure 14A:
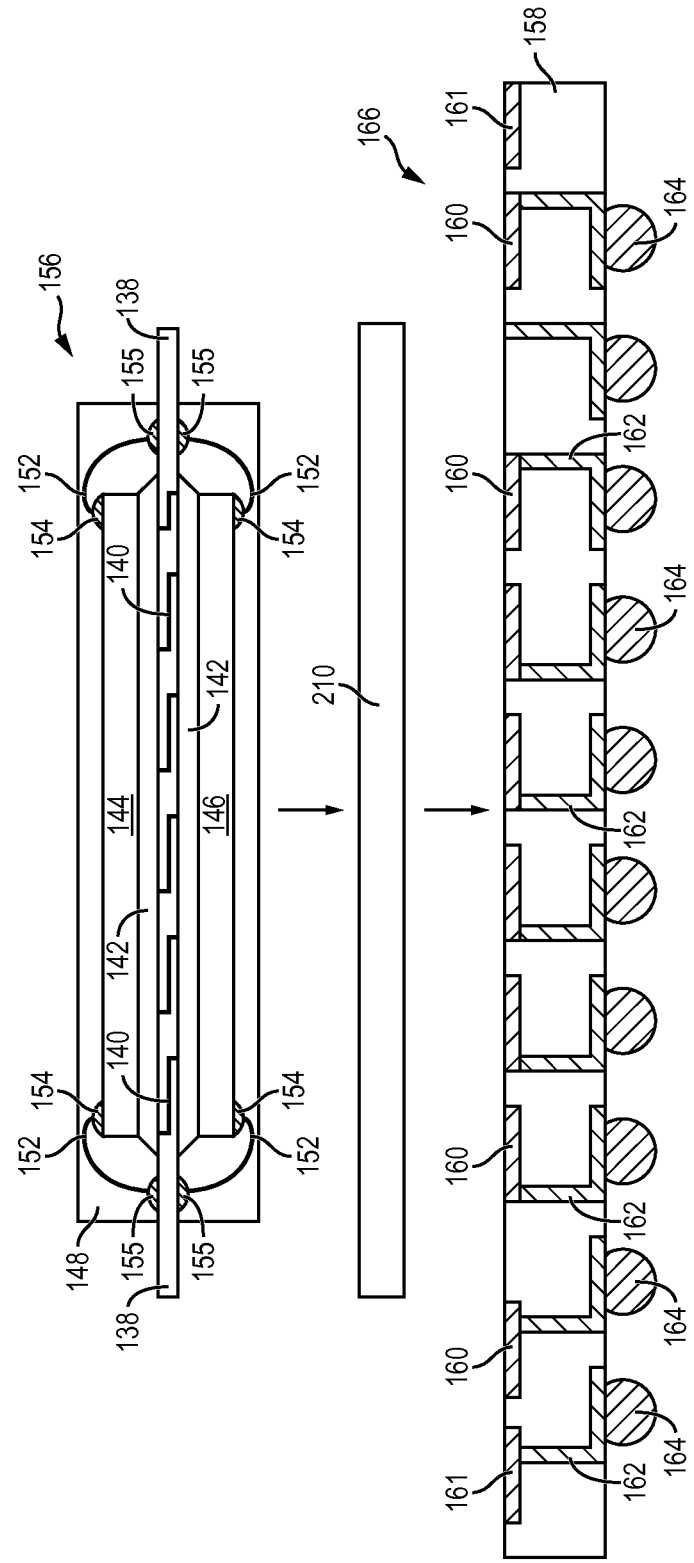
FIGS. 14a-14d illustrate cross-sectional views of an example process for forming a PiP structure with a flip chip and DSM ISM for a plurality of semiconductor devices.

FIGS. 14*a*-14*d* illustrate cross-sectional views of an example process for forming a PiP structure 224 (FIG. 14*d*) having a flip chip semiconductor die 210 and having a DSM ISM 156 for a plurality of semiconductor devices. FIG. 14*a*, which is an exploded view, illustrates how some components of the PiP structure 224 are assembled relative to each other. Circuit carrier 166, the details of which were described above (with reference to FIGS. 9*a*-9*d*), is arranged at the bottom of the PiP structure 224. DSM ISM 156, the details of which were also described above (with reference to FIGS. 8*a*-8*d*), is arranged near the top of the PiP structure 224. Semiconductor die 210 is disposed between the chip carrier 166 and the DSM ISM 156.

In this embodiment, semiconductor die 210 is a flip chip device, where an active surface of the semiconductor die 210 is "flipped" and disposed proximate to the substrate 158. The flip chip configuration provides a short electrical conduction path from the active devices on semiconductor die 210 to bond pads 160 on the substrate 158, thereby reducing signal propagation, lowering parasitic capacitance, and achieving overall better circuit performance. Although not shown in FIG. 14a, semiconductor die 210 includes contact pads and bumps, similar to the contact pads 132 and bumps 134 of the semiconductor die 124 of FIGS. 5a-5c.

Figure 14B:
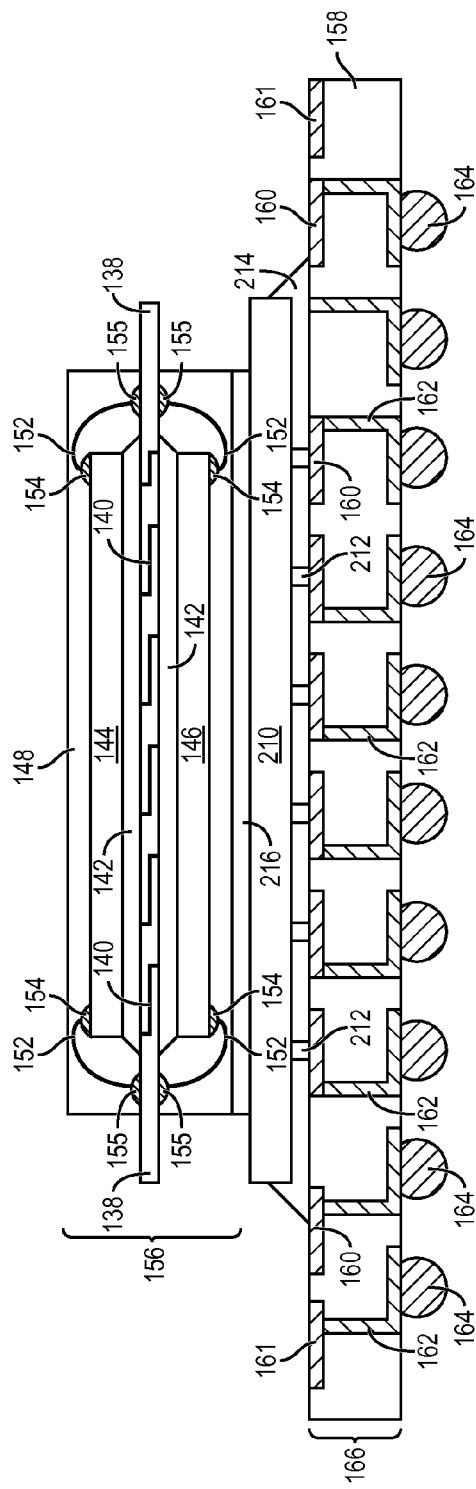

Now referring to FIG. 14b, semiconductor die 210 is placed on the substrate 158 to make electrical contact with conductive vias 162 and bumps 164 by way of interconnects 212, which may be implemented with the bumps and contact pads of the flip chip device. An underfill material 214 is disposed between semiconductor die 210 and substrate 158.

After that, a DSM ISM 156 is attached to semiconductor die 210 with die attach adhesive 216. DSM ISM 156 is directly attached to and in physical contact with semiconductor die 210 by way of adhesive 216 to reduce headroom requirements and increase device packing density. DSM ISM 156 includes two semiconductor die 144 and 146. The semiconductor die 144 and 146 of DSM ISM 156 are enclosed in molding compound 148 for structural support. Semiconductor die 144 and 146 are electrically connected with metal traces 140. In addition, semiconductor die 144 and 146 may be connected through metal traces 140 using bond wires 152 connected to bond pads 154. In one embodiment, semiconductor die 144 and 146 are memory devices.

Figure 14C:
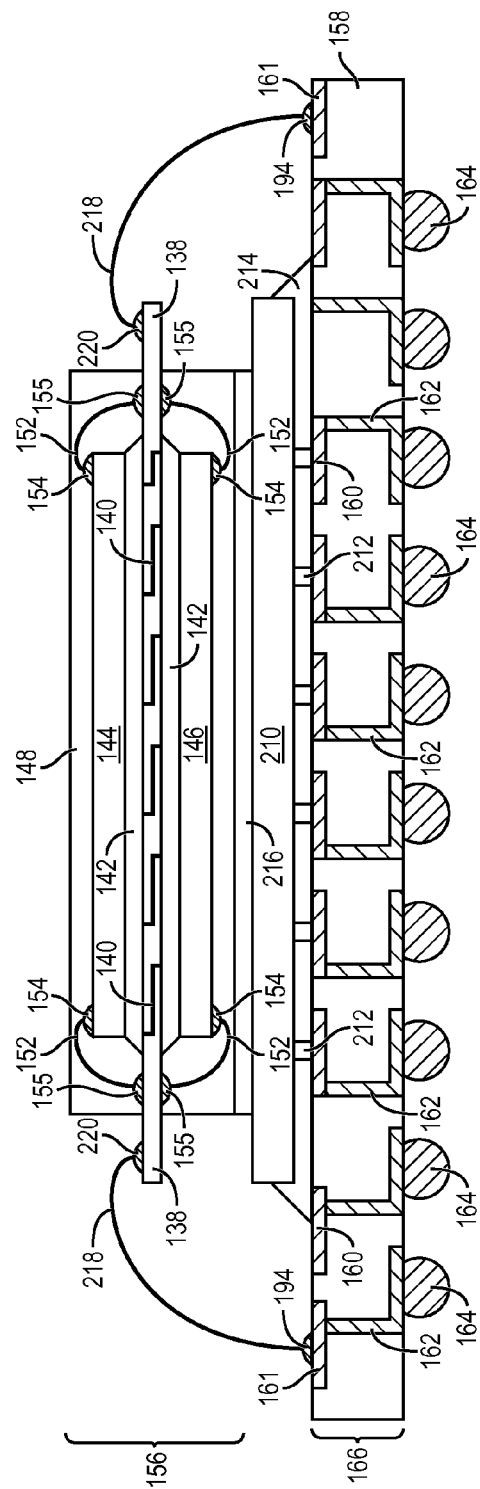

Now, referring to FIG. 14c, bond pads 194 are formed on the bond pads 161 to electrically couple with the bond pads 161. Similarly, bond pads 220 are formed on the platform 138 to electrically couple with the semiconductor die 144, 146 via the metal traces 140. Bond pads 194, 220 are made with a conductive material, such as Al, Cu, Sn, Ni, Au, Ag, or combinations thereof.

Next, bond wires 218 are attached to the bond pads 194 and 220 to electrically couple the semiconductor die 144, 146 to the bond pads 161. The bond wires 218 are formed using a capillary bonding tool, a support for the device to be wirebonded, a source of heat, a source and transducer to impart ultrasound vibration to the capillary bonding tool, and automated control for coordinating the movement and function of these machinery elements. Bond wires 218 may be made of aluminum (Al), gold (Au), or some other suitable metal or metal alloy.

Thus, semiconductor die 210 is electrically connected to bond pads 160 on substrate 158 by way of interconnects 212. Similarly, the DSM ISM 156, which includes the semiconductor die 144, 146, is electrically connected to bond pads 161 on substrate 158 by way of bond wires 218. Bond pads 160 and 161 electrically connect through conductive vias 162 to bumps 164. The electrical signals transfer in/out of the PiP structure 224 to/from the semiconductor die 144, 146, 210 within the PiP structure through the bumps 164, conductive vias 162, interconnects 212, and wire bonds 218.

Figure 14D:
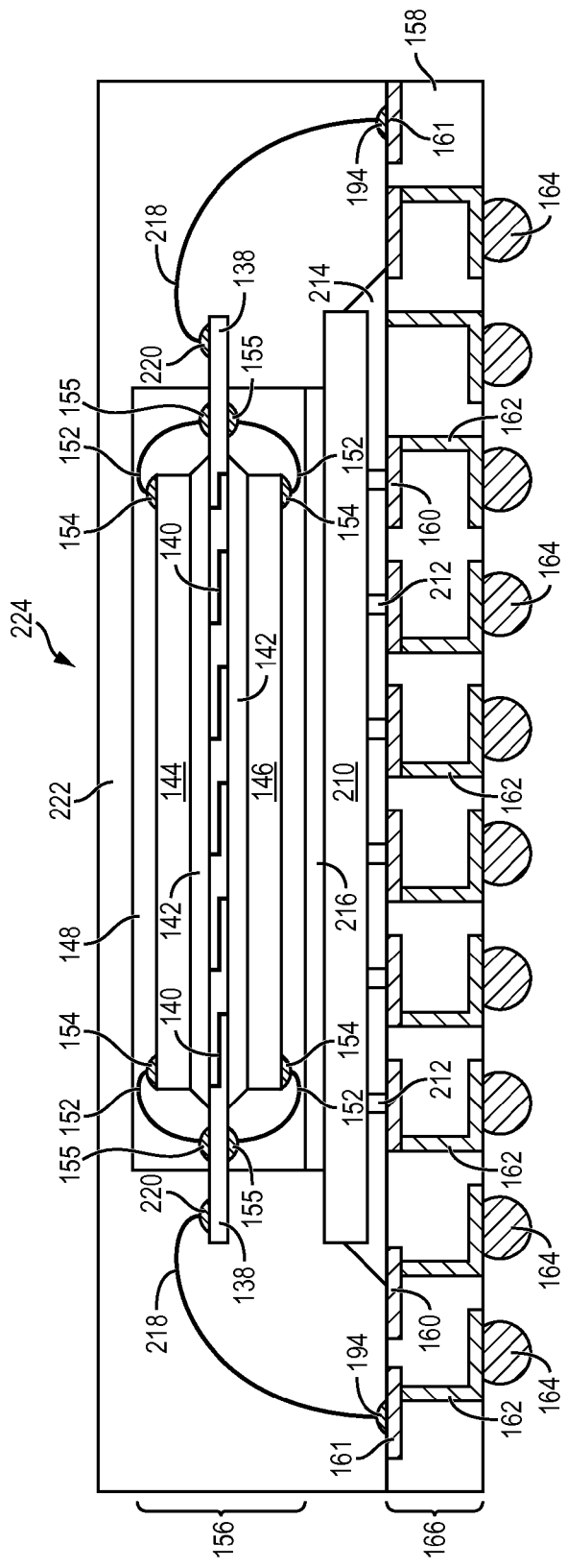

Next, referring to FIG. 14d, an encapsulating material, such as a molding compound 222, is deposited over the DSM ISM 156 and semiconductor die 210 to form the PiP structure 224. The molding compound 222 may be deposited around the DSM ISMs 156, around bond pads 194, 220, around bond wires 218, and around semiconductor die 210 to surround and cover them. The molding compound 222 may be formed using a paste printing, compressive molding, transfer molding, liquid encapsulant molding, vacuum lamination, spin coating, or other suitable applicator. In one embodiment, molding compound 222 is deposited using a film-assisted molding process.

Molding compound 222 may be polymer composite material, such as epoxy resin with filler, epoxy acrylate with filler, or polymer with proper filler. Molding compound 222 is non-conductive and environmentally protects the semiconductor devices from external elements and contaminants.

Relative to the structure of FIG. 1, the PiP structure 224 provides greater storage capacity of semiconductor die by eliminating a dummy spacer between the semiconductor die and ISM within the package. The PiP structure 224 reduces the height and size of the package and increases overall device packing density.

Figure 15:
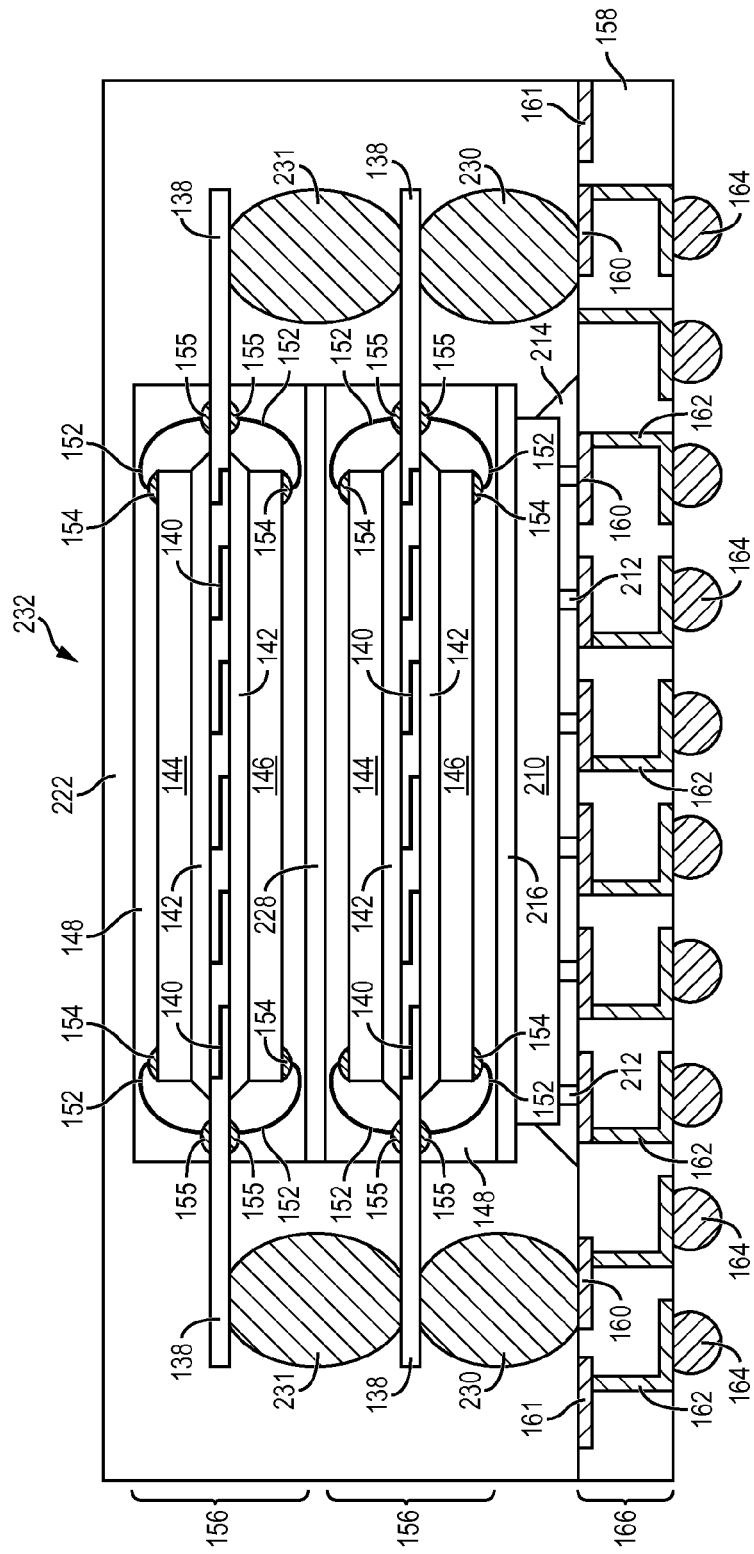
FIG. 15 illustrates a cross-sectional view of a PiP structure with a flip chip and two stacked DSM ISMs.

FIG. 15 illustrates a cross-sectional view of a PiP structure 232 with a semiconductor die 210 and two stacked DSM ISMs 156. Comparing FIG. 14d to FIG. 15, some noticeable differences between the PiP structure 232 of FIG. 15 and the PiP structure 224 of FIG. 14d are that a second DSM ISM 156 has been added relative to PiP structure 224, that the platforms 138 of DSM ISMs 156 are noticeably longer, and that bumps 230 and 231 replace the bond wires 218 and bond pads 194, 220 of PiP structure 224.

In this embodiment, semiconductor die 210 is a flip chip device, where an active surface of the semiconductor die 210 is "flipped" and disposed proximate to the substrate 158. The flip chip configuration provides a short electrical conduction path from the active devices on semiconductor die 210 to bond pads 160 on the substrate 158, thereby reducing signal propagation, lowering parasitic capacitance, and achieving overall better circuit performance. Although not shown in FIG. 15, semiconductor die 210 includes contact pads and bumps, similar to the contact pads 132 and bumps 134 of the semiconductor die 124 of FIGS. 5a-5c.

Still referring to FIG. 15, semiconductor die 210 is placed on the substrate 158 to make electrical contact with conductive vias 162 and bumps 164 by way of interconnects 212, which may be implemented with the bumps and contact pads of the flip chip device. An underfill material 214 is disposed between semiconductor die 210 and substrate 158.

After that, bumps 230 are formed on a surface of the substrate 158 to electrically couple with the bond pads 160. To form the bumps 230, an electrically conductive bump material is deposited on substrate 158 using an evaporation, electrolytic plating, electroless plating, ball drop, or screen printing process. The electrically conductive bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder.

The bump material is bonded to conductive vias 160 using a suitable attachment or bonding process. In one embodiment, the bump material is reflowed by heating the material above its melting point to form spherical balls or bumps 230. In some applications, bumps 230 are reflowed a second time to improve electrical contact with bond pads 160. The bumps can also be compression bonded to bond pads 160.

After that, a lowermost DSM ISM 156 is attached to semiconductor die 210 with die attach adhesive 216. The lowermost DSM ISM 156 is directly attached to and in physical contact with semiconductor die 210 by way of adhesive 216 to reduce headroom requirements and increase device packing density. The lowermost DSM ISM 156 is also electrically coupled to the bumps 230 by way of the metal traces 140, which contact the bumps 230. DSM ISM 156 includes two semiconductor die 144 and 146. In one embodiment, semiconductor die 144 and 146 are memory devices.

Next, bumps 231 are formed on platform 138 of the lowermost DSM ISM 156 to electrically couple with the metal traces 140. To form the bumps 231, an electrically conductive bump material is deposited on platform 138 using an evaporation, electrolytic plating, electroless plating, ball drop, or screen printing process. The electrically conductive bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder.

The bump material is bonded to metal traces 140 of the platform 138 using a suitable attachment or bonding process. In one embodiment, the bump material is reflowed by heating the material above its melting point to form spherical balls or bumps 231. In some applications, bumps 231 are reflowed a second time to improve electrical contact with metal traces 140. The bumps can also be compression bonded to metal traces 140.

Next, an uppermost DSM ISM 156 is attached to lowermost DSM ISM with die attach adhesive 228. The uppermost DSM ISM 156 is directly attached to and in physical contact with lowermost DSM ISM 156 by way of adhesive 228 to reduce headroom requirements and increase device packing density. The uppermost DSM ISM 156 is also electrically coupled to the bumps 231 by way of the metal traces 140, which contact the bumps 231. The uppermost DSM ISM 156 includes two semiconductor die 144 and 146. In one embodiment, semiconductor die 144 and 146 are memory devices.

Thus, semiconductor die 210 is electrically connected to bond pads 160 on substrate 158 by way of interconnects 212. The lowermost DSM ISM 156, which includes the semiconductor die 144, 146, is electrically connected to bond pads 160 on substrate 158 by way of bumps 230. Similarly, the uppermost DSM ISM 156, which includes the semiconductor die 144, 146 is electrically coupled to bond pads 160 by way of bumps 231 and bumps 230. Bond pads 160, 161, electrically connect through conductive vias 162 to bumps 164.

Thus, electrical signals transfer in and out of semiconductor die 144 and 146 in the lowermost DSM ISM 156 through platforms 138 and bumps 230 to conductive vias 162 to bumps 164. Similarly, the uppermost DSM ISM 156 is electrically connected to bond pads 160 on substrate 158 by way of bumps 231 and 230. Electrical signals transfer in and out of semiconductor die 144 and 146 of the uppermost DSM ISM 156 through platforms 138, bumps 231, platforms 138 of the lowermost DSM ISM 156, and bumps 230 to conductive vias 162, and finally to bumps 164.

Next, still referring to FIG. 15, an encapsulating material, such as a molding compound 222, is deposited over the two DSM ISMs 156, the bumps 230, 231, and semiconductor die 210 to form the PiP structure 224. The molding compound 222 may be deposited around the DSM ISMs 156, around semiconductor die 210, and around bumps 230, 231 to surround and cover them. The molding compound 222 may be formed using a paste printing, compressive molding, transfer molding, liquid encapsulant molding, vacuum lamination, spin coating, or other suitable applicator. In one embodiment, molding compound 222 is deposited using a film-assisted molding process.

Molding compound 222 may be polymer composite material, such as epoxy resin with filler, epoxy acrylate with filler, or polymer with proper filler. Molding compound 222 is non-conductive and environmentally protects the semiconductor devices from external elements and contaminants.

Relative to the PiP structure of FIG. 1, the PiP structure 224 provides greater storage capacity of semiconductor die by eliminating a dummy spacer between the semiconductor die and ISM within the package. The PiP structure 224 reduces the height and size of the package and increases overall device packing density. The storage capacity of the PiP structure 232 is increased even further relative to FIG. 1 by stacking multiple DSM ISMs 156 without a significant increase in vertical headroom. The PiP structure 232 reduces the height and size of the package and increases overall device packing density.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a substrate;
   disposing a first semiconductor die over the substrate;
   providing a first double side mold (DSM) internal stackable module (ISM) by,
   (a) providing a platform including conductive traces formed in the platform,
   (b) disposing a second semiconductor die over a first surface of the platform,
   (c) disposing a third semiconductor die over a second surface of the platform opposite the first surface of the platform, and
   (d) depositing a first encapsulant over the second semiconductor die and third semiconductor die;
   disposing the first DSM ISM over the first semiconductor die after depositing the first encapsulant over the first semiconductor die and third semiconductor die
   forming a first bond wire between the platform and substrate; and
   depositing a second encapsulant over the first bond wire, substrate, and first DSM ISM including depositing the second encapsulant over the second semiconductor die and third semiconductor die.

2. The method of claim 1, further including disposing a second DSM ISM over the first DSM ISM.

3. The method of claim 2, further including forming a second bond wire between the second DSM ISM and substrate.

4. The method of claim 1, further including forming a second bond wire between the first semiconductor die and substrate.

5. The method of claim 1, further including:
   disposing an interposer over the first DSM ISM prior to depositing the second encapsulant;
   depositing the second encapsulant over the interposer, first DSM ISM, first bond wire, and substrate; and
   forming an opening in the second encapsulant extending to the interposer.

6. The method of claim 5, further including forming a second bond wire between the interposer and platform.

7. A method of making a semiconductor device, comprising:
   providing a substrate;
   providing a first double side mold (DSM) internal stackable module (ISM) by,
   (a) providing a platform,
   (b) disposing a first semiconductor die over a first surface of the platform,
   (c) disposing a second semiconductor die over a second surface of the platform opposite the first surface of the platform, and (d) depositing a first encapsulant over the first semiconductor die and second semiconductor die completely embedding the first and second semiconductor die;
disposing the first DSM ISM over the substrate;
forming a first bond wire between the platform and substrate; and
depositing a second encapsulant over the first DSM ISM, first bond wire, and substrate.

8. The method of claim 7, further including disposing a third semiconductor die over the substrate.

9. The method of claim 7, further including disposing a second DSM ISM over the first DSM ISM.

10. The method of claim 9, further including forming a second bond wire between the second DSM ISM and substrate.

11. The method of claim 7, further including:
forming a second bond wire between the first semiconductor die and platform; and
forming a third bond wire between the second semiconductor die and platform.

12. The method of claim 7, further including:
disposing an interposer over the first DSM ISM prior to depositing the second encapsulant;
depositing the second encapsulant over the interposer, first DSM ISM, first bond wire, and substrate; and
forming an opening in the second encapsulant extending to the interposer.

13. The method of claim 12, further including forming a second bond wire between the interposer and platform.

14. A method of making a semiconductor device, comprising:
providing a substrate;
providing a first double side mold (DSM) internal stackable module (ISM);
disposing the first DSM ISM over the substrate;
forming a first bond wire between the first DSM ISM and substrate;
depositing a first encapsulant over the first DSM ISM, first bond wire, and substrate;
disposing an interposer over the first DSM ISM prior to depositing the first encapsulant;
depositing the first encapsulant over the interposer, first DSM ISM and substrate; and
forming an opening in the first encapsulant extending to the interposer.

15. The method of claim 14, wherein providing the first DSM ISM includes:
providing a platform;
disposing a first semiconductor die over a first surface of the platform;
disposing a second semiconductor die over a second surface of the platform opposite the first surface of the platform; and
depositing a second encapsulant over the first semiconductor die and second semiconductor die.

16. The method of claim 15, further including:
forming a second bond wire between the first semiconductor die and platform; and
forming a third bond wire between the second semiconductor die and platform.

17. The method of claim 14, further including disposing a semiconductor die over the substrate.

18. The method of claim 14, further including:
disposing a second DSM ISM over the first DSM ISM; and
forming a second bond wire between the second DSM ISM and substrate.

19. A method of making a semiconductor device, comprising:
providing a substrate;
providing a first double side mold (DSM) internal stackable module (ISM);
disposing the first DSM ISM over the substrate;
depositing a first encapsulant over the first DSM ISM and substrate;
disposing an interposer over the first DSM ISM prior to depositing the first encapsulant;
depositing the first encapsulant over the interposer, first DSM ISM and substrate; and
forming an opening in the first encapsulant extending to the interposer.

20. The method of claim 19, wherein providing the first DSM ISM includes:
providing a platform;
disposing a first semiconductor die over a first surface of the platform;
disposing a second semiconductor die over a second surface of the platform opposite the first surface of the platform; and
depositing a second encapsulant over the first semiconductor die and second semiconductor die.

21. The method of claim 20, further including forming a bond wire between the first semiconductor die and platform.

22. The method of claim 19, further including disposing a semiconductor die over the substrate.

23. The method of claim 19, further including disposing a second DSM ISM over the first DSM ISM.

\* \* \* \* \*

UNITED STATES PATENT AND TRADEMARK OFFICE
CERTIFICATE OF CORRECTION

PATENT NO. : 9,245,772 B2
APPLICATION NO. : 14/328348
DATED : January 26, 2016
INVENTOR(S) : JoungIn Yang et al.

It is certified that error appears in the above-identified patent and that said Letters Patent is hereby corrected as shown below:

Claims

Column 18, line 32, Claim 1, replace "over the first" with --over the second--.

Signed and Sealed this
Twenty-sixth Day of April, 2016

Michelle K. Lee
*Director of the United States Patent and Trademark Office*